US012685161B2

(12) United States Patent
Aleksov et al.

(10) Patent No.: US 12,685,161 B2
(45) Date of Patent: Jul. 14, 2026

(54) GLASS-BASED CAVITY AND CHANNELS FOR COOLING OF EMBEDDED DIES AND 3D INTEGRATED MODULES USING PACKAGE SUBSTRATES WITH GLASS CORE

(71) Applicant: Intel Corporation, Santa Clara, CA (US)

(72) Inventors: Aleksandar Aleksov, Chandler, AZ (US); Telesphor Kamgaing, Chandler, AZ (US); Neelam Prabhu Gaunkar, Chandler, AZ (US); Georgios C. Dogiamis, Chandler, AZ (US); Veronica Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 386 days.

(21) Appl. No.: 17/349,695

(22) Filed: Jun. 16, 2021

(65) Prior Publication Data

US 2022/0406686 A1     Dec. 22, 2022

(51) Int. Cl.
*H10W 40/47* (2026.01)
*H10W 40/00* (2026.01)
(Continued)

(52) U.S. Cl.
CPC ......... *H10W 40/47* (2026.01); *H10W 40/037* (2026.01); *H10W 40/43* (2026.01);
(Continued)

(58) Field of Classification Search
CPC . H01L 23/473; H01L 21/486; H01L 21/4882; H01L 23/13; H01L 23/15;
(Continued)

(56) References Cited

U.S. PATENT DOCUMENTS

| | | | |
|---|---|---|---|
| 5,929,518 A | 7/1999 | Schlaiss | |
| 6,684,007 B2 * | 1/2004 | Yoshimura | G02B 6/43 |
| | | | 257/E25.032 |

(Continued)

FOREIGN PATENT DOCUMENTS

| | | |
|---|---|---|
| WO | WO-9217903 | 10/1992 |

OTHER PUBLICATIONS

International Preliminary Report on Patentability for International Patent Application No. PCT/US2022/022329, mailed Dec. 28, 2023, 7 pages.

(Continued)

*Primary Examiner* — Leonard Chang
*Assistant Examiner* — Tsz K Chiu
(74) *Attorney, Agent, or Firm* — Schwabe, Williamson & Wyatt, P.C.

(57) ABSTRACT

Embodiments disclosed herein include package substrates and methods of forming such package substrates. In an embodiment a package substrate comprises a core with a first surface and a second surface opposite from the first surface. In an embodiment, a buildup layer is over the first surface of the core. In an embodiment, a channel is through the core, where the channel extends in a direction that is substantially parallel to the first surface.

17 Claims, 19 Drawing Sheets

(51) Int. Cl.

| | |
|---|---|
| *H10W 40/43* | (2026.01) |
| *H10W 70/05* | (2026.01) |
| *H10W 70/63* | (2026.01) |
| *H10W 70/65* | (2026.01) |
| *H10W 70/68* | (2026.01) |
| *H10W 70/692* | (2026.01) |

(52) U.S. Cl.
CPC ....... *H10W 70/095* (2026.01); *H10W 70/635* (2026.01); *H10W 70/65* (2026.01); *H10W 70/68* (2026.01); *H10W 70/692* (2026.01)

(58) Field of Classification Search
CPC ............. H01L 23/467; H01L 23/49827; H01L 23/49838; H01L 23/49816; H01L 23/3677; H01L 23/5384; H10W 40/47; H10W 90/00; H10W 90/701; H10W 40/228; H10W 90/288; H10W 20/20; H10W 20/42; H10W 70/635; H10W 72/29; H10W 72/90; H10W 90/722; H10W 40/037; H10W 72/252; H10W 90/297; H10W 20/435; H10W 40/255; H10W 40/40; H10W 40/70; H10W 40/778; H10W 70/60; H10W 70/614; H10W 72/241; H10W 72/874; H10W 72/9413; H10W 74/117; H10W 70/611; H10W 70/692; H10W 72/072; H10W 72/073; H10W 72/951; H10W 74/15; H10W 90/724; H10W 90/734; H10W 20/0245; H10W 40/22; H10W 40/253; H10W 40/43; H10W 40/73; H10W 70/095; H10W 70/655; H10W 72/01515; H10W 72/075; H10W 72/5449; H10W 72/932; H10W 90/756; H10W 20/0249; H10W 20/212; H10W 40/10; H10W 40/226; H10W 70/093; H10W 70/65; H10W 70/68; H10W 70/682; H10W 70/69; H10W 72/01; H10W 72/07252; H10W 72/07254; H10W 72/07354; H10W 72/20; H10W 72/227; H10W 72/244; H10W 72/247; H10W 72/30; H10W 72/325; H10W 72/347; H10W 72/351; H10W 72/352; H10W 72/353; H10W 72/354; H10W 72/551; H10W 72/851; H10W 72/856; H10W 72/877; H10W 72/884; H10W 72/942; H10W 72/944; H10W 74/00; H10W 74/114; H10W 76/13; H10W 76/15; H10W 76/161; H10W 76/42; H10W 80/00; H10W 80/314; H10W 90/22; H10W 90/732; H10W 90/792; H10W 99/00; H10W 20/023; H10W 40/254; H10W 40/257; H10W 40/475; H10W 40/77; H10W 70/685; H10W 72/823; H10W 72/926; H10W 76/138; H10W 80/721; H10W 90/401; H10W 90/794
See application file for complete search history.

(56) References Cited

U.S. PATENT DOCUMENTS

| | | | |
|---|---|---|---|
| 9,129,929 B2 | 9/2015 | Lundberg | |
| 10,304,700 B2 | 5/2019 | Liu | |
| 10,943,851 B1 * | 3/2021 | Elsherbini | H01L 25/0652 |
| 11,581,242 B2 * | 2/2023 | Chanemougame | H01L 27/0688 |
| 11,735,495 B2 * | 8/2023 | Karhade | H01L 21/486 257/713 |
| 2006/0022334 A1 * | 2/2006 | Myers | H01L 29/0657 257/E29.022 |
| 2007/0096289 A1 | 5/2007 | Enomoto | |
| 2008/0044127 A1 * | 2/2008 | Leising | G02B 6/43 385/14 |
| 2008/0266787 A1 | 10/2008 | Gosset et al. | |
| 2008/0315403 A1 * | 12/2008 | Andry | H01L 25/0657 257/713 |
| 2009/0057879 A1 * | 3/2009 | Garrou | H01L 23/481 257/713 |
| 2009/0213547 A1 | 8/2009 | Schulz-Harder | |
| 2010/0187683 A1 * | 7/2010 | Bakir | H01L 23/53276 257/713 |
| 2011/0031633 A1 | 2/2011 | Hsu et al. | |
| 2011/0205708 A1 * | 8/2011 | Andry | H01L 23/3677 438/122 |
| 2016/0037680 A1 * | 2/2016 | Hou | H05K 7/20345 361/699 |
| 2018/0342451 A1 | 11/2018 | Dahlberg | |
| 2020/0043829 A1 | 2/2020 | Elsherbini | |
| 2020/0098668 A1 * | 3/2020 | Eid | H01L 23/427 |
| 2020/0203256 A1 | 6/2020 | Neal et al. | |
| 2020/0211927 A1 * | 7/2020 | Wan | H10W 40/47 |
| 2020/0219816 A1 | 7/2020 | Aleksov | |
| 2020/0227340 A1 | 7/2020 | Lu | |
| 2021/0074608 A1 | 3/2021 | Hsu | |
| 2021/0098335 A1 | 4/2021 | Yu | |
| 2021/0098380 A1 | 4/2021 | Chen | |
| 2022/0404568 A1 * | 12/2022 | Aleksov | G02B 6/4253 |
| 2022/0406685 A1 * | 12/2022 | Kamgaing | H01L 23/49827 |

OTHER PUBLICATIONS

International Search Report and Written Opinion for International Application No. PCT-US2022/022329, mailed Jul. 25, 2022, 10 pages.
Extended European Search Report for European Patent Application No. 22825491.8 mailed Apr. 3, 2025, 9 pgs.
Office Action for U.S. Appl. No. 17/349,684 mailed Sep. 25, 2024, 25 pgs.
Final Office Action for U.S. Appl. No. 17/349,684 mailed May 20, 2025, 13 pgs.

* cited by examiner

GLASS-BASED CAVITY AND CHANNELS FOR COOLING OF EMBEDDED DIES AND 3D INTEGRATED MODULES USING PACKAGE SUBSTRATES WITH GLASS CORE

TECHNICAL FIELD

Embodiments of the present disclosure relate to electronic packages, and more particularly to package substrates with a glass core with fluidic channels to enable cooling through the package substrate.

BACKGROUND

Packaging technology now plays an increasingly crucial role in the integration of complex and more powerful computational systems. Advanced packaging architectures are critical for enabling heterogeneous integration. In addition, computational systems on packages are becoming increasingly power hungry. For example, some systems may be in the 300 W or more power range. Future power levels may even rise to 1 kW or greater. As such, thermal management is an increasingly important design parameter in order to handle such high power levels.

Typically, thermal energy is removed from the system mostly through the top of the die. This is suitable for single strata computational systems since silicon has a high thermal conductivity. However, in multi-strata systems the inclusion of additional heat extraction paths becomes increasingly critical. With existing architectures, thermal energy cannot be sufficiently dissipated through the package substrate due to the low thermal conductivity of packaging substrates and the need to accommodate signaling and power delivery paths.

EMBODIMENTS OF THE PRESENT DISCLOSURE

Figure 1A:
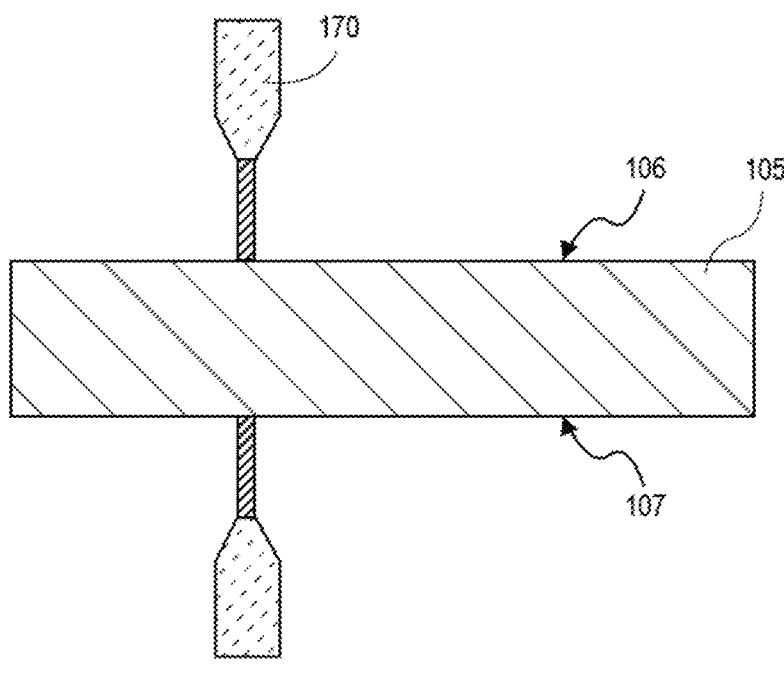
FIG. 1A is a cross-sectional illustration of a glass core with top and bottom surfaces that are being exposed with a laser, in accordance with an embodiment.

Described herein are package substrates with a glass core with fluidic channels to enable cooling through the package substrate, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal management of electronic packages currently relies on removal of thermal energy through the top of the semiconductor dies. Typically, this involves the use of an integrated heat spreader (IHS) and a heatsink over the IHS. Currently, there are no effective architectures that allow for the removal of thermal energy from below the die through the package substrate.

Accordingly, embodiments described herein include the use of cooling channels that are embedded in a package layer such as a core, a buildup layer or an interposer. The ability to flow a coolant below the semiconductor die (or dies) allows for thermal management from below the die in addition to the top surface of the die. As such, high power architectures can still be adequately cooled.

In an embodiment, the cooling channels are enabled by the use of a laser-assisted etching process. Generally, the laser-assisted etching process involves exposing the package core to a laser that changes a morphology of the package core. The morphology change allows for a wet etching process to remove the exposed regions, and provides a channel embedded within the core. For example, the package core may be glass, and the morphological change may be from an amorphous crystal structure to a crystalline crystal structure. In other embodiments, the package core may be ceramic, silicon, or any other non-conductive semiconductor material.

In addition to forming cooling channels, the laser-assisted etching process may also be leveraged to form vias through the package core. The cooling channels and the vias may both be routed through the package core due, in part, to the ability to form high density (small pitch) features with the laser-assisted etching process. Whereas existing through core vias have diameters of 100 μm or larger and pitches of 250 μm or larger, the laser-assisted etching process may enable hole diameters that are approximately 50 μm or smaller and pitches that are approximately 40 μm or larger. Diameters of the holes may be able to be approximately 10 μm without masks, and potentially as small as 2 μm when a hardmask is also used. The thickness of the core may also be between approximately 100 μm and 1,000 μm. Though it is to be appreciated that embodiments may also apply to larger and/or smaller hole diameters, hole pitches, and core substrate thicknesses. While the cooling channels are described extensively as being routed through the package core, it is to be appreciated that portions of the cooling channels may also be routed through buildup layers above and/or below the package core.

Referring now to FIGS. 1A-1D, a series of cross-sectional illustrations depicting a laser-assisted etching process to form features in a package core is shown, in accordance with an embodiment. As shown in FIG. 1A, the package core 105 is exposed by a laser 170. The laser 170 may be irradiated over both a first surface 106 and a second surface 107. However, the laser 170 may only irradiate a single surface of the core substrate 105 in other embodiments.

In an embodiment, the package core 105 may comprise a material that is capable of forming a morphological change as a result of the exposure by the laser 170. For example, in the case of a glass package core 105, the morphological change may result in the conversion of an amorphous crystal structure to a crystalline crystal structure. While glass is used as an example here, it is to be appreciated that the package core 105 may also comprise ceramic materials, silicon, or other non-conductive semiconductor materials. In an embodiment, the package core 105 may have a thickness between the first surface 106 and the second surface 107 that is between 100 μm and 1,000 μm. However, it is to be appreciated that larger or smaller thicknesses may also be used for the package core 105 in other embodiments.

Figure 1B:
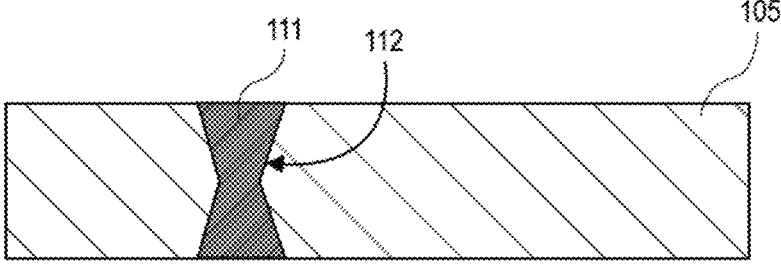
FIG. 1B is a cross-sectional illustration of the glass core with regions that have their morphology altered by the laser, in accordance with an embodiment.

Referring now to FIG. 1B, a cross-sectional illustration of the package core 105 after the morphological change has occurred is shown, in accordance with an embodiment. As shown, an exposed region 111 is provided through a thickness of the package core 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the package core 105.

While shown as providing an exposed region 111 that passes through an entire thickness of the package core 105, it is to be appreciated that laser parameters may be modified in order to provide different structures. For example, a blind structure may be formed. A blind structure extends into, but not through, the package core 105. Additionally, buried structures may also be formed. In a buried structure, the exposed region 111 is positioned between (in the vertical direction) unmodified regions of the package core 105. Such buried structures may be used to provide cooling channels and will be described in greater detail below.

Figure 1C:
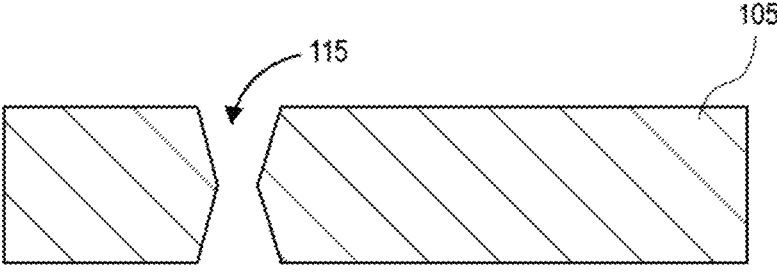
FIG. 1C is a cross-sectional illustration of the glass core with a via hole through a thickness of the glass core, in accordance with an embodiment.

Referring now to FIG. 1C, a cross-sectional illustration of the package core 105 after the exposed region 111 is removed to form a hole 115 through the package core 105 is shown, in accordance with an embodiment. In an embodiment, the hole 115 may be formed with an etching process that is selective to the exposed region 111 over the remainder of the package core 105. The etch selectivity of the exposed region 111 to the remainder of the package core 105 may be 10:1 or greater, or 50:1 or greater. That is, while selective to the exposed region 111, some portion of the package core 105 may also be etched, resulting in the thickness of the package core 105 being slightly reduced. In an embodiment, the etchant may be a wet etching chemistry.

Figure 1D:
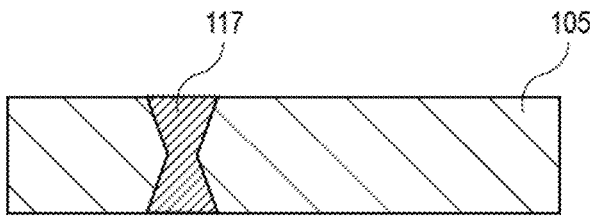
FIG. 1D is a cross-sectional illustration of the glass core with a via through the thickness of the glass core, in accordance with an embodiment.

Referring now to FIG. 1D, a cross-sectional illustration of the core substrate 105 after a via 117 is formed in the hole 115 is shown, in accordance with an embodiment. In an embodiment, the via 117 may be deposited with a plating process or any other suitable deposition process. In yet another embodiment, the hole 115 may remain unfilled in order to provide features such as liquid cooling channels.

In an embodiment, the hole 115 may have a maximum diameter that is approximately 100 µm or less, approximately 50 µm or less, or approximately 10 µm or less. The pitch between individual holes 115 in the package core 105 may be between approximately 10 µm and approximately 100 µm in some embodiments. The small diameters and pitch (compared to traditional plated through hole (PTH) vias that typically have diameters that are 100 µm or larger and pitches that are 100 µm or larger) allow for high density integration of vias and cooling channels.

In FIGS. 1A-1D only a single cross-section of the package core 105 is shown for simplicity. However, it is to be appreciated that the shape of the vias 117 or cooling channels may take substantially any form. This is because the laser providing the morphological change in the package core 105 may be moved in a controllable manner. Examples of various plan views of a via 217 in a package core 205 are shown in FIGS. 2A and 2B.

Figure 2A:
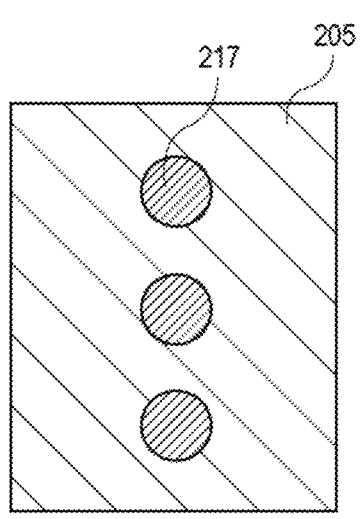
FIG. 2A is a plan view illustration of the glass core with a plurality of circular vias, in accordance with an embodiment.

Referring now to FIG. 2A, a plan view illustration of a package core 205 with a plurality of circular vias 217 is shown, in accordance with an embodiment. While three vias 217 are shown, it is to be appreciated that any number of vias 217 may be provided in any configuration.

Figure 2B:
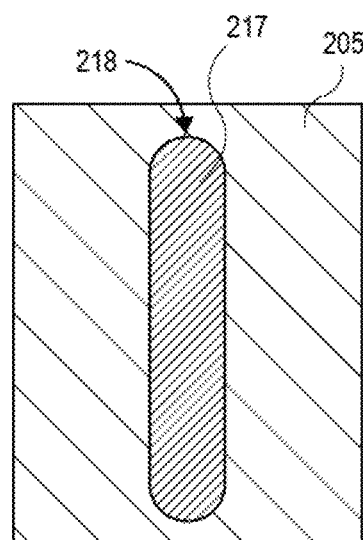
FIG. 2B is a plan view illustration of the glass core with a vertical via plane, in accordance with an embodiment.

Referring now to FIG. 2B, a plan view illustration of a package core 205 with a via 217 that is extended along one direction is shown, in accordance with an embodiment. Such a via 217 may be referred to herein as a "via plane" or simply a "plane". The via plane 217 may have a thickness through the package core 205 that is substantially uniform, while also being extended in a direction, as opposed to having a width and length that are substantially uniform. As shown in FIG. 2B, the ends of the via structure 217 may be rounded surfaces 218. The rounded surfaces may be the result of the shape of the laser irradiation. That is, the focus of the laser may be substantially circular in some embodiments. While shown as being filled with a material, it is also possible to form elongated shapes that are hollow in order to form fluidic cooling channels, as will be described in greater detail below.

Figure 3A:
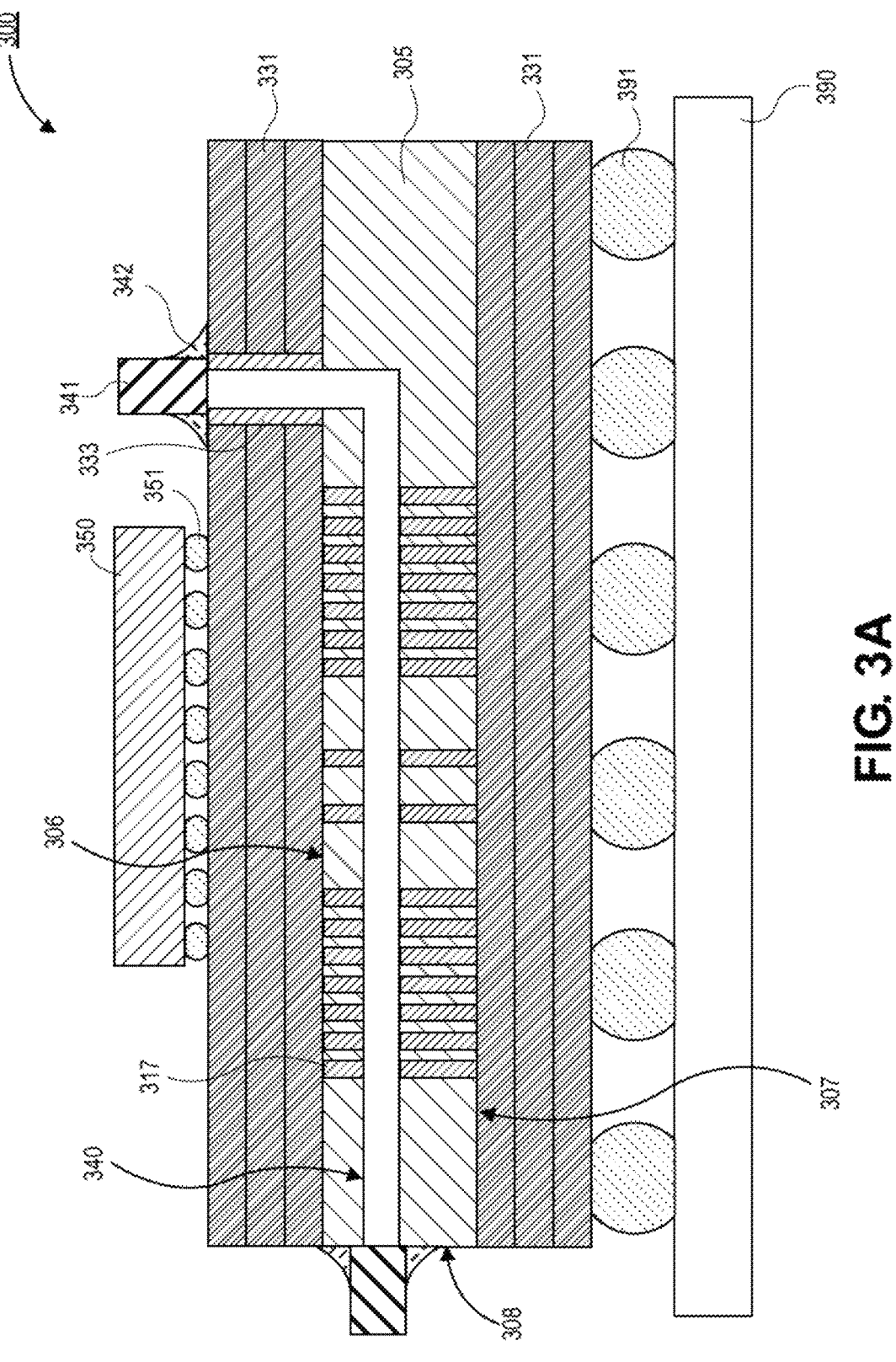
FIG. 3A is a cross-sectional illustration of an electronic package with a cooling channel that has an inlet along a side of a glass core and an outlet on a top surface of the glass core, in accordance with an embodiment.

Referring now to FIG. 3A, a cross-sectional illustration of an electronic package 300 is shown, in accordance with an embodiment. In an embodiment, the electronic package 300 comprises a package substrate that is coupled to a board 390 by interconnects 391, such as solder balls, sockets, or the like. In an embodiment, the package substrate comprises a core 305 and buildup layers 331 over and under the core 305. A die 350 may be coupled to the buildup layers 331 by first level interconnects (FLIs) 351.

In an embodiment, the core 305 is a material that can be morphologically altered by a laser. For example, the core 305 may be glass. Exposing the glass to certain laser parameters allows for an amorphous crystal structure to be converted into a crystalline structure that is susceptible to a wet etching chemistry. However, other materials may be used as the core, such as ceramics, silicon, or other non-conductive semiconductor materials.

In an embodiment, the core 305 may comprise through core vias 317 that pass from a first surface 306 to a second surface 307 of the core 305. The vias 317 may be formed with a laser-assisted etching process, similar to processes such as those described above. While shown with substantially vertical sidewalls, it is to be appreciated that the vias 317 may comprise sloped sidewalls in some embodiments.

The core 305 may also comprise a fluidic channel 340. The fluidic channel 340 may also be fabricated using a laser-assisted etching process, as will be described in greater detail below. The fluidic channel 340 is shown intersecting the vias 317 for simplicity in order to show the vias 317 and the fluidic channel 340 in the same image. It is to be appreciated that the vias 317 and the fluidic channel 340 are in different planes and will not intersect each other. Furthermore, while a single fluidic channel 340 is shown, it is to be appreciated that any number of fluidic channels 340 may be embedded within the core 305. In an embodiment, the diameter of the fluidic channel 340 may be approximately 20 µm or greater. In a particular embodiment, the diameter of the fluidic channel 340 may be up to approximately 350 µm. Particularly, it is to be appreciated that the diameter of the fluidic channel 340 may at least partially depend on the overall thickness of the core 305. For example, thicker cores 305 may enable larger diameter fluidic channels 340. In one embodiment, the maximum diameter of the fluidic channel 340 may be approximately one-half the thickness of the core 305.

In an embodiment, the fluidic channel 340 may have inlet/outlets 341. The inlets/outlets 341 may be secured to the package substrate by an adhesive 342 or the like. In an embodiment, a first inlet/outlet 341 is provided along a sidewall 308 of the core 305. That is, the fluidic channel 340 may extend all the way to an edge of the core 305. In an embodiment, a second inlet/outlet 341 is provided above a top surface 306 of the core 305. That is, the fluidic channel 340 may have a vertical portion that extends up to the buildup layers 331 above the top surface 306 of the core 305. A barrier layer 333, such as copper, may surround sidewalls of the fluidic channel 340 that pass through the buildup layers 331. The second inlet/outlet 341 is adhered to the top buildup layer 331.

The inlet/outlets 341 may be fluidically coupled to coolant reservoirs that supply a cooling fluid to the fluidic channel 340. The cooling fluid may be a liquid, such as water, or a gas. In some embodiments, the coolant reservoir may be shared with a coolant loop (not shown) that is used to cool a top surface of the die 350. Though in other embodiments, the coolant loop that includes fluidic channel 340 may be isolated from other thermal solutions in the electronic package 300.

It is to be appreciated that the arrangement of the fluidic channel 340 in FIG. 3A is exemplary in nature, and that other arrangements of the inlet/outlets 341 may be used in accordance with additional embodiments. For example, FIGS. 3B-3F provide additional arrangements of the inlet/outlets 341 that may be used in different embodiments.

Figure 3B:
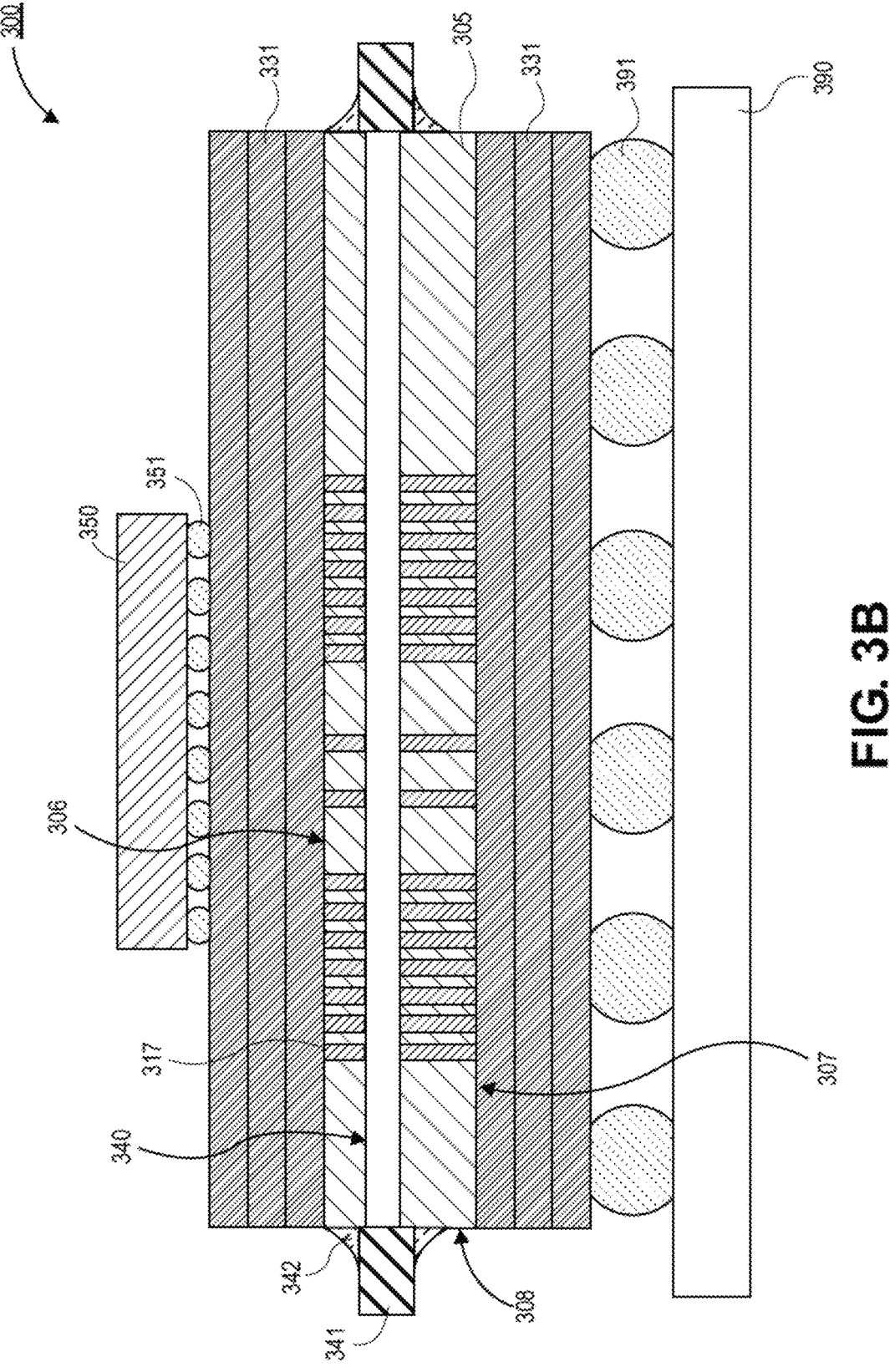
FIG. 3B is a cross-sectional illustration of an electronic package with a cooling channel that has an inlet along a side of a glass core and an outlet on an opposite side of the glass core, in accordance with an embodiment.

Referring now to FIG. 3B, a cross-sectional illustration of an electronic package 300 is shown, in accordance with an additional embodiment. Instead of having a sidewall 308 inlet/outlet 341 and a top surface 306 inlet/outlet 341, the embodiment shown in FIG. 3B includes a pair of sidewall 308 inlet/outlets 341. In such an embodiment, the fluidic channel 340 may extend across a width of the core 305. In some embodiments, the side-to-side orientation of the fluidic channel 340 may allow for a fluidic channel 340 that does not require a vertical section in order to route the fluid up or down through a thickness of the core. Additionally, since there is no need to pass through the buildup layers 331, barriers 333 around portions of the channel 340 may be omitted. As shown in FIG. 3B, the sidewalls 308 are on opposite ends of the core 305. However, in other embodiments, the inlet/outlets 341 may be on adjacent sidewalls 308.

Figure 3C:
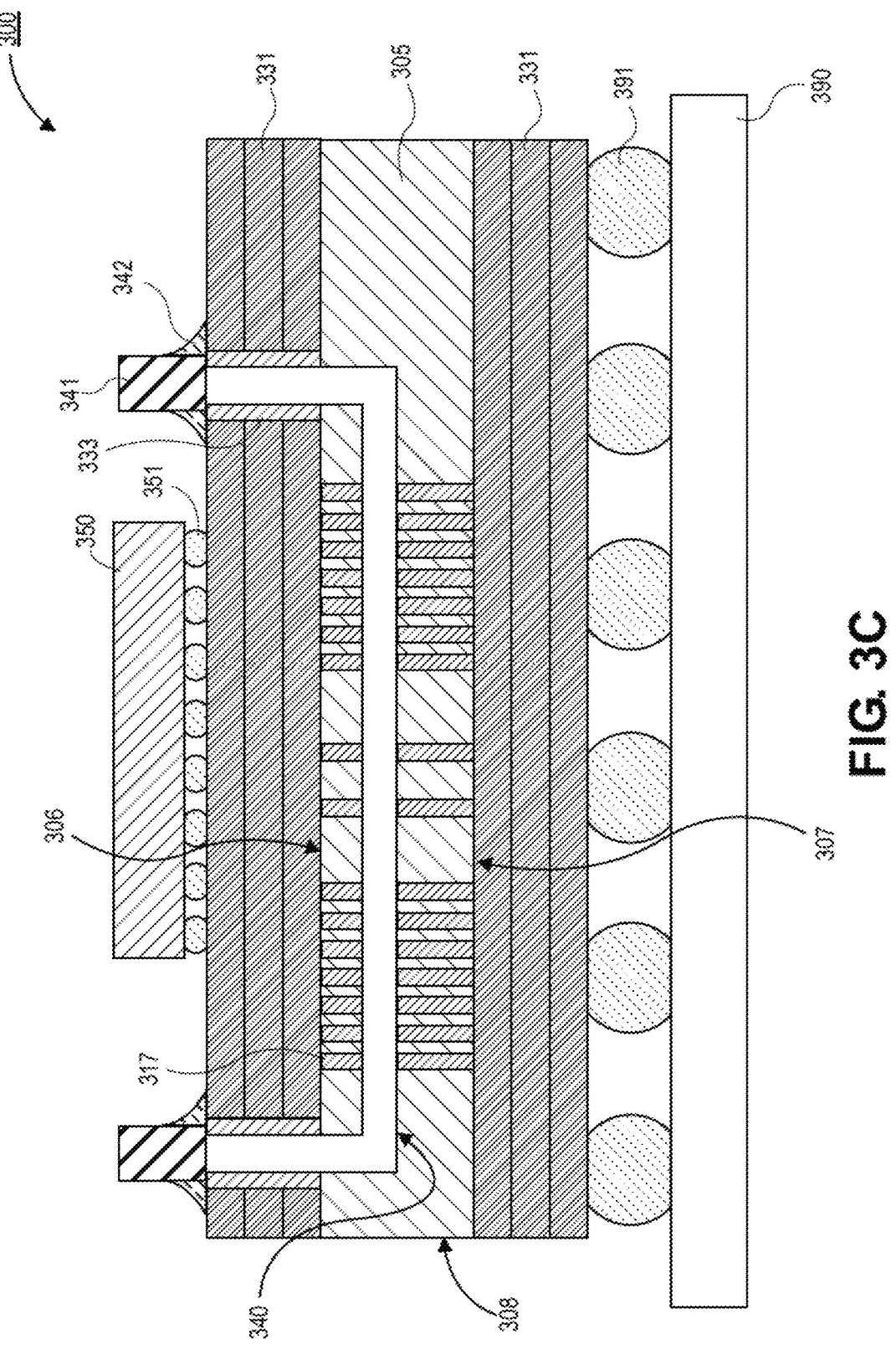
FIG. 3C is a cross-sectional illustration of an electronic package with a cooling channel that has an inlet and an outlet on a top surface of the glass core, in accordance with an embodiment.

Referring now to FIG. 3C, a cross-sectional illustration of an electronic package 300 is shown, in accordance with an additional embodiment. In an embodiment, the electronic package 300 is similar to the electronic package in FIG. 3A, with the exception of both inlet/outlets 341 being provided over a top surface 306 of the core 305. That is, the inlet/outlets 341 exit the package substrate on the same surface as the die 350. Providing the inlet/outlets 341 on the top surface of the package substrate may allow for easier integration with existing fluidic systems used to cool the top surface of the die 350. Additionally, since the fluidic channel 340 does not need to extend to the edge 308 of the core 305, the fluidic channel 340 and the inlet/outlets 341 may be provided closer to the die 350.

Figure 3D:
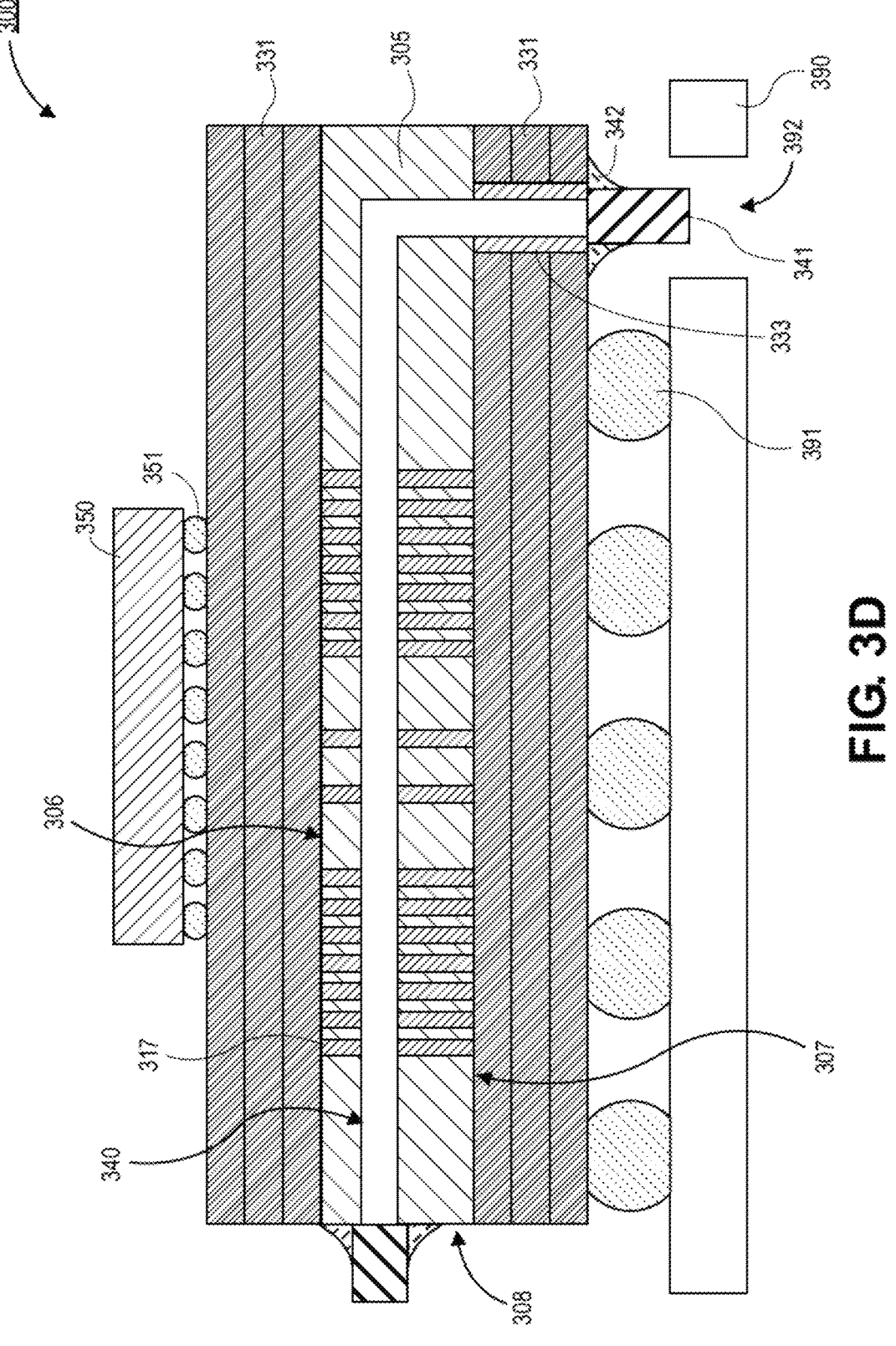
FIG. 3D is a cross-sectional illustration of an electronic package with a cooling channel that has an inlet on a side of a glass core and an outlet on a bottom surface of the glass core, in accordance with an embodiment.

Referring now to FIG. 3D, a cross-sectional illustration of an electronic package 300 is shown, in accordance with an additional embodiment. The electronic package 300 may be substantially similar to the electronic package 300 in FIG. 3A, with the exception of the fluidic channel 340 being routed down to a bottom surface 307 of the core 305. Routing the fluidic channel 340 downward may require a gap 392 formed in the board 390 in order to accommodate the inlet/outlet 341.

Figure 3E:
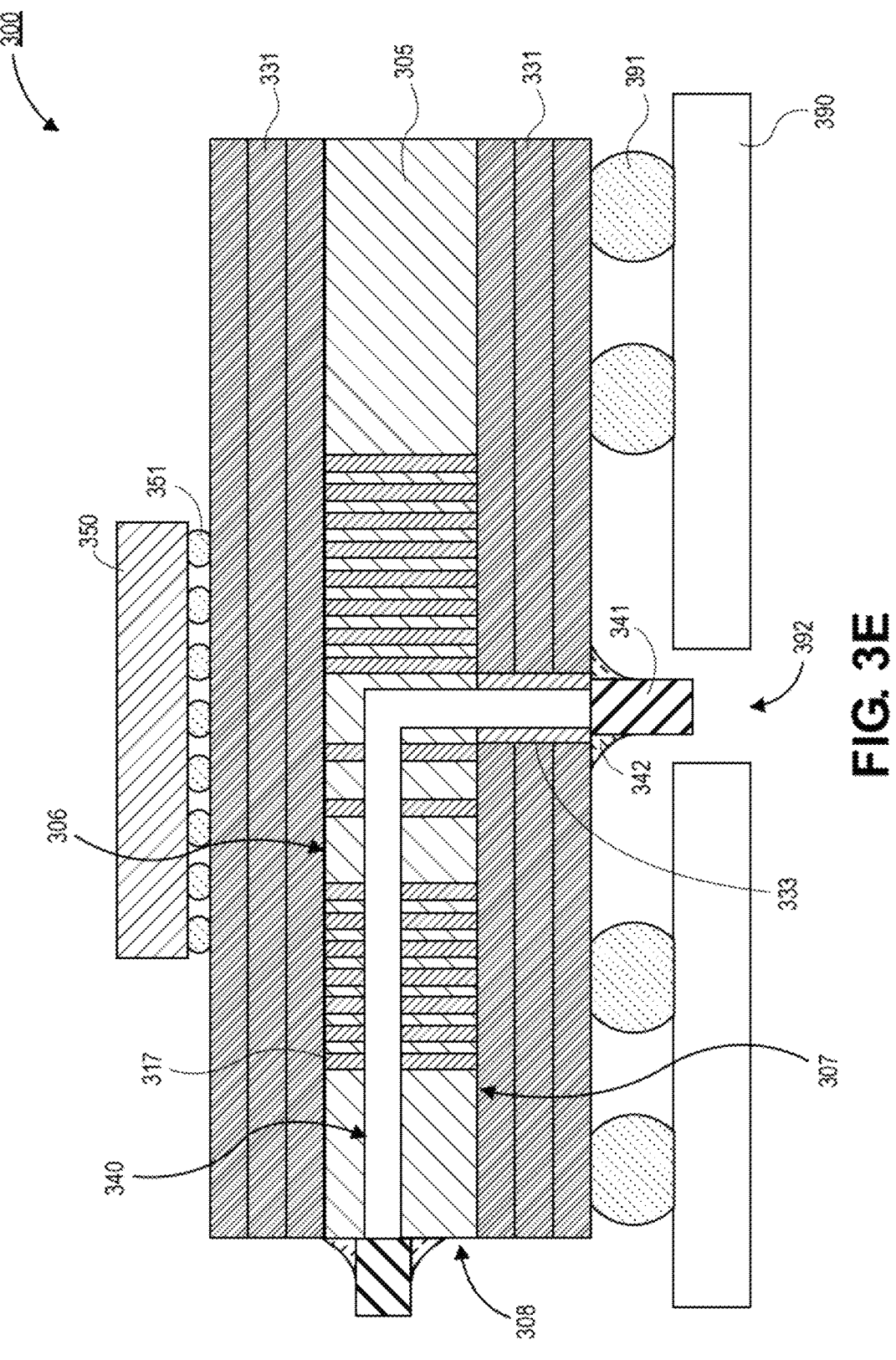
FIG. 3E is a cross-sectional illustration of an electronic package with a cooling channel that has an inlet on a side of a glass core and an outlet on a bottom surface of the glass core below the die, in accordance with an embodiment.

Referring now to FIG. 3E, a cross-sectional illustration of an electronic package 300 is shown, in accordance with an additional embodiment. The electronic package 300 may be substantially similar to the electronic package 300 in FIG. 3D, with the exception of the location of the inlet/outlet 341 on the bottom surface. Instead of the fluidic channel 340 passing entirely across the footprint of the die 350, the inlet/outlet 341 is positioned within the footprint of the die 350.

Figure 3F:
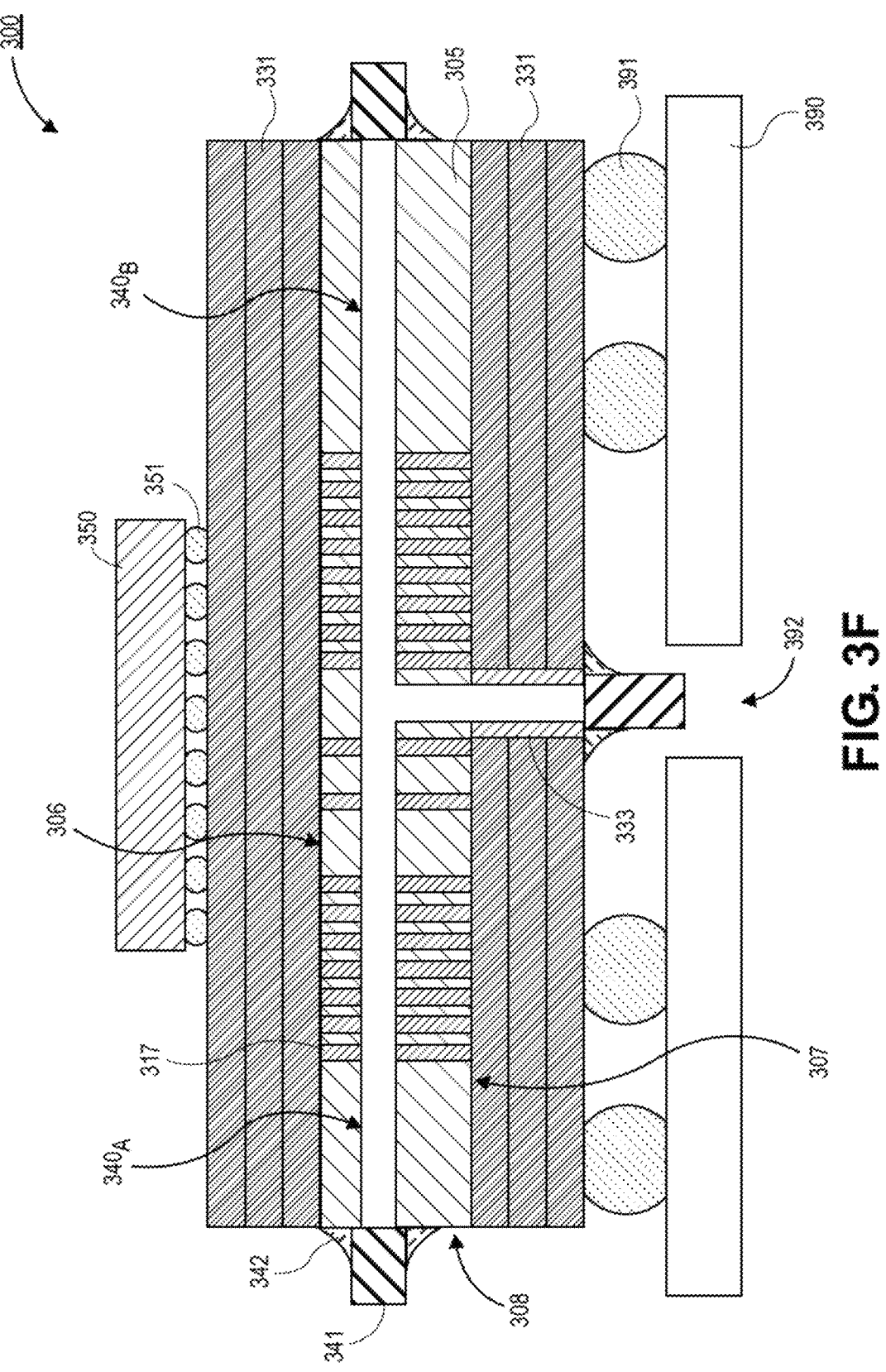
FIG. 3F is a cross-sectional illustration of an electronic package with a cooling channel that has a pair of inlets and a single outlet, in accordance with an embodiment.

Referring now to FIG. 3F, a cross-sectional illustration of an electronic package 300 is shown, in accordance with yet another embodiment. The electronic package 300 may be substantially similar to the electronic package 300 in FIG. 3E, with the exception of there being two inlets 341 that feed a single outlet 341. As shown, inlets 341 may be provided on opposite sidewalls 308 of the core 305. The fluidic channels 340$_A$ and 340$_B$ flow to the middle of the core 305 and extend down to the outlet 341 below the bottom surface 307 of the core 305. That is, one or more of the fluidic channels 340 in the electronic package 300 may merge together in some embodiments.

Figure 4A:
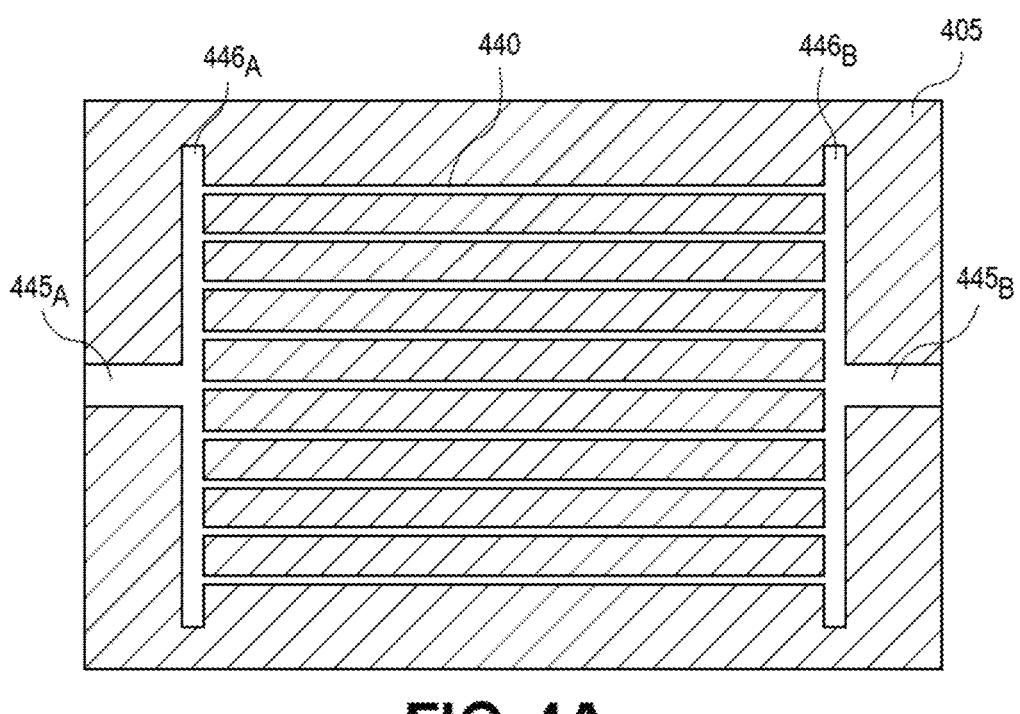
FIG. 4A is a plan view illustration of a plurality of cooling channels in a core substrate, in accordance with an embodiment.
Figure 4B:
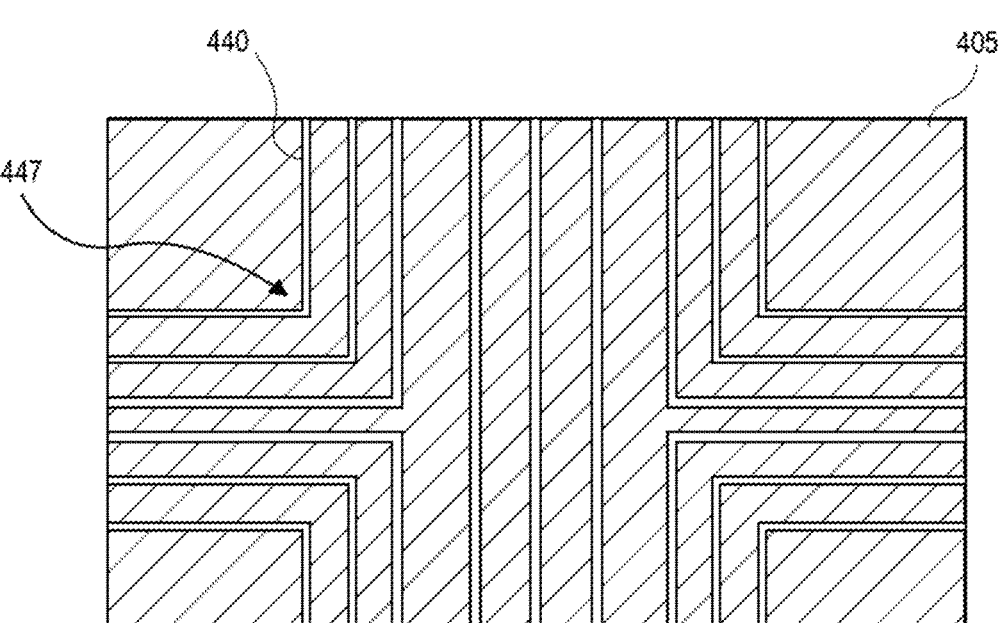
FIG. 4B is a plan view illustration of a plurality of cooling channels that include turns, in accordance with an embodiment.
Figure 4C:
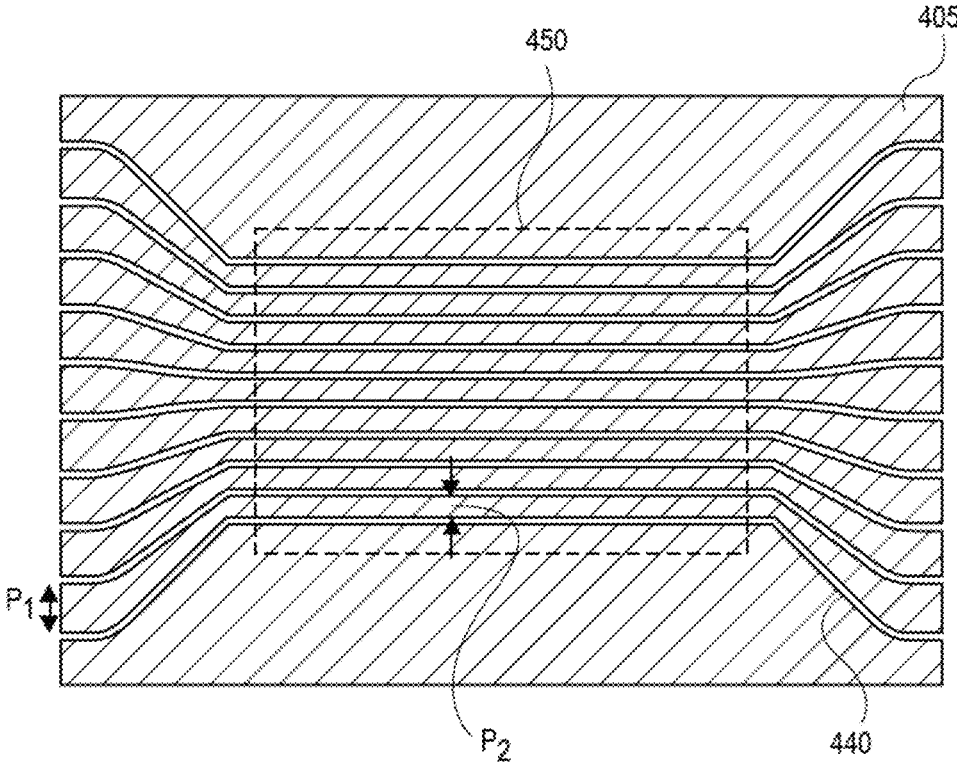
FIG. 4C is a plan view illustration of a plurality of cooling channels that comprise a first pitch outside of the die footprint and a smaller second pitch within the die footprint, in accordance with an embodiment.

Referring now to FIGS. 4A-4C, plan view illustrations depicting the layout of a plurality of fluidic channels 440 in a core 405 are shown, in accordance with various embodiments. In FIGS. 4A-4C, other features in the core (e.g., vias and the like) are omitted for clarity. However, it is to be appreciated that features such as vias may be provided between and/or around the fluidic channels 440. Additionally, while the ends of the fluidic channels 440 in FIGS. 4A-4C all end at the core edge, it is to be appreciated that vertical connections may also be used to route the fluidic channels 440 to the top and bottom surfaces, as shown in embodiments above.

Referring now to FIG. 4A, a plan view illustration of core 405 in a package substrate is shown, in accordance with an embodiment. As shown, a plurality of fluidic channels 440 may be substantially parallel to each other and extend across the core 405. Additionally, the plurality of fluidic channels 440 may be coupled to a single inlet 445$_A$ and a single outlet 445$_B$. The first ends of the fluidic channels 440 may each be fluidically coupled to a reservoir 446$_A$ that is connected to the inlet 445$_A$, and the second ends of the fluidic channels 440 may each be fluidically coupled to a collecting basin 446$_B$ that is connected to the outlet 445$_B$.

Referring now to FIG. 4B, a plan view illustration of a core 405 in a package substrate is shown, in accordance with an embodiment. As shown, the fluidic channels 440 may include linear paths or paths that include a turn. For example, the center three fluidic channels 440 extend from a top edge to the bottom edge in a linear path. The fluidic channels 440 along the periphery include a turn 447. The turn 447 allows for the fluidic channels 440 to start at a first edge and end at a neighboring edge. In an embodiment, the turn 447 may be approximately 90°. However, it is to be appreciated that turns of other angles may also be used in order to provide routing of the fluidic channels 440 between vias or other features. Additionally, while a single turn 447 is shown along each fluidic channel 440, it is to be appreciated that fluidic channels 440 may include any number of turns.

Referring now to FIG. 4C, a plan view illustration of a core 405 of a package substrate is shown, in accordance with an additional embodiment. As shown, a plurality of fluidic channels 440 extend from a first edge to an opposite second edge. The fluidic channels 440 extend under a footprint of the die 450 (indicated with a dashed line). The fluidic channels 440 may have a first pitch $P_1$ outside of the footprint of the die 450 and a second pitch $P_2$ inside the footprint of the die 450. The first pitch $P_1$ may be larger than the second pitch $P_2$. Such a configuration may allow for a fanning out of the fluidic channels 440. This makes assembly less demanding, while at the same time increasing the density of the channels 440 under the footprint of the die 450. As such, improved cooling effort below the die 450 can be provided.

While several examples of routing paths for fluidic channels 440 are shown in FIGS. 4A-4C, it is to be appreciated that embodiments are not limited to such configurations. Particularly, the laser-assisted etching process allows for the creation of fluidic channels 440 with any shaped path through the core 405. Different paths can be produced by moving the laser in the desired pattern. As such, routing the fluidic channels 440 around conductive features (e.g., vias, etc.) is easily obtainable.

Figure 5:
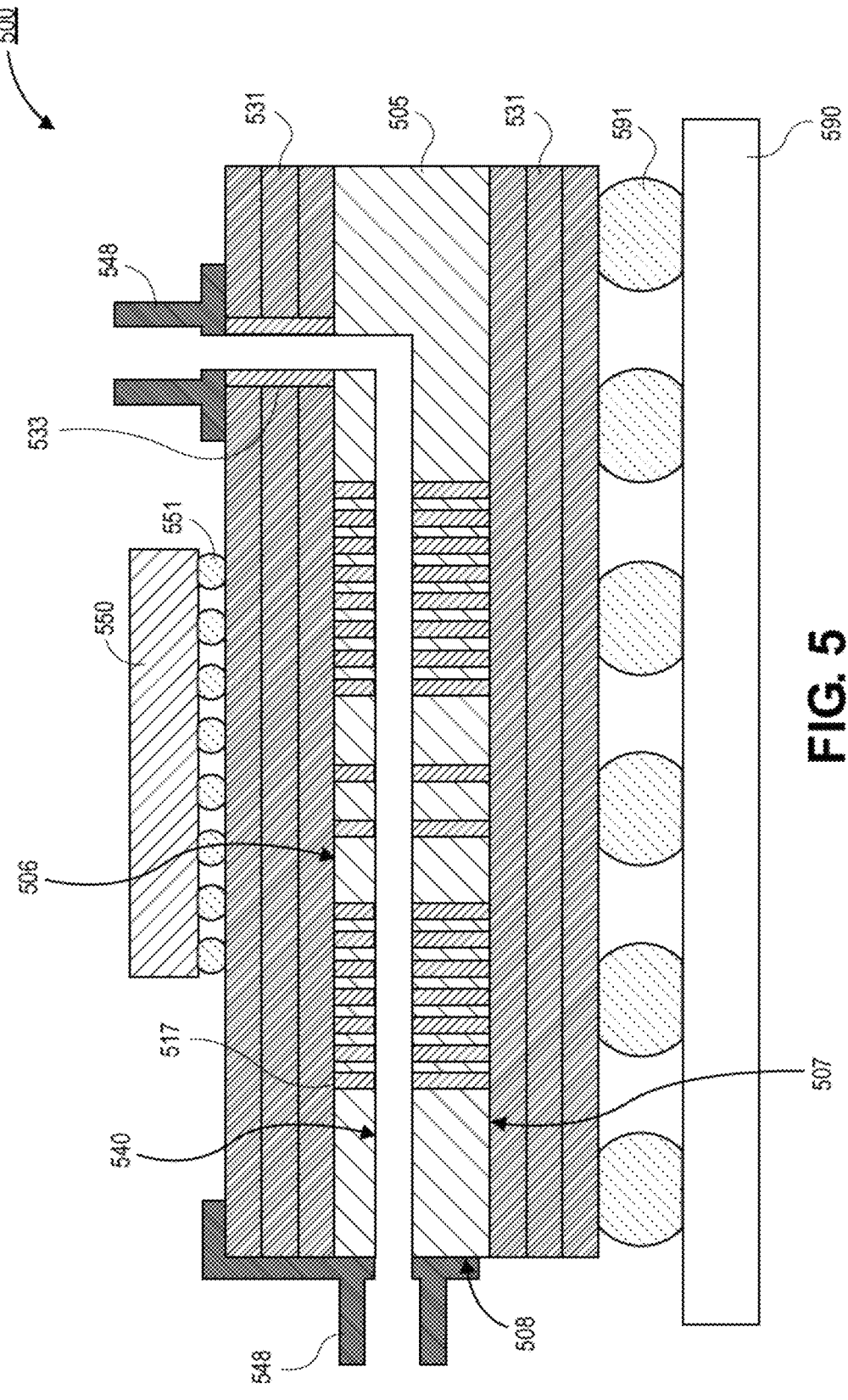
FIG. 5 is a cross-sectional illustration of an electronic package with a cooling channel that is accessed by external connectors attached to the electronic package, in accordance with an embodiment.

Referring now to FIG. 5, a cross-sectional illustration of an electronic package 500 is shown, in accordance with an embodiment. The electronic package 500 comprises a board 590 attached to a package substrate by interconnects 591. The package substrate comprises a core 505 and buildup layers 531. The core comprises a top surface 506, a bottom surface 507, and sidewalls 508. In an embodiment, a die 550 is attached to the buildup layers 531 by FLIs 551. In an embodiment, fluidic channels 540 are embedded in the core 505 and routed around vias 517. The fluidic channel 540 may have a first end at the sidewall 508 and a second end that is above the top surface 506 of the core 505. A barrier layer 533 may surround a portion of the fluidic channel 540 that passes through the buildup layers 531.

The electronic package 500 may be substantially similar to the electronic package 300 in FIG. 3A, with the exception of the substitution of external connectors 548 in the place of the inlet/outlets 341. The external connectors 548 may be adhered to the package substrate by solder, glue, or any other suitable adhesive. As shown by the external connector 548 on the sidewall 508 of the core 505, the external connector 548 may also wrap around a corner to provide improved mechanical support. The external connectors 548 may be used to fluidically couple the fluidic channels 540 to a coolant source. While shown in the context of an electronic package similar to the one illustrated in FIG. 3A, it is to be appreciated that external connectors may be used with electronic packages in accordance with any embodiment described herein.

Referring now to FIGS. 6A-6F, a series of cross-sectional illustrations depicting a process for forming a core with embedded fluidic channels using a laser-assisted etching process is shown, in accordance with an embodiment.

Figure 6A:
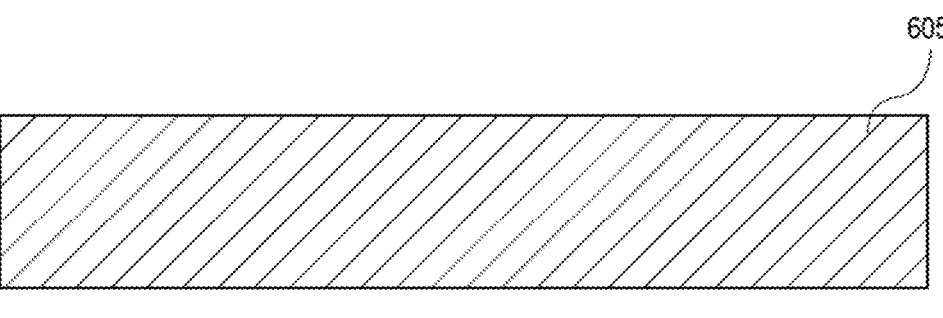
FIGS. 6A-6F are cross-sectional illustrations depicting a process for forming cooling channels in a substrate core, in accordance with an embodiment.

Referring now to FIG. 6A, a cross-sectional illustration of a core 605 is shown, in accordance with an embodiment. In an embodiment, the core 605 may comprise a material that can be morphologically changed by exposure to a laser. For example the core 605 may comprise glass, ceramic, silicon, or other non-conductive semiconductors. The core 605 may have a thickness that is between 50 μm and 1,000 μm, though thicker or thinner cores 605 may also be possible in some embodiments.

Figure 6B:
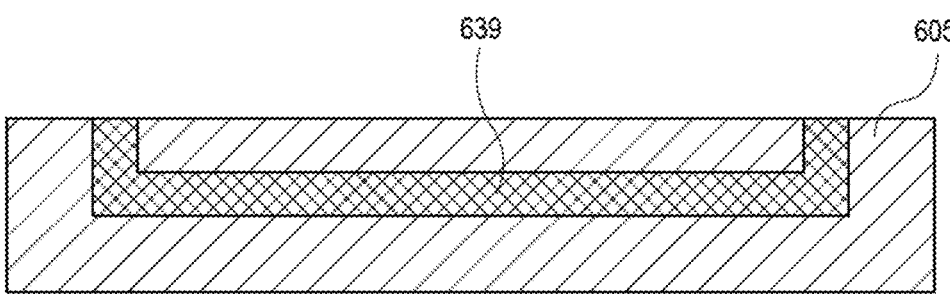

Referring now to FIG. 6B, a cross-sectional illustration of the core 605 after a laser exposure is shown, in accordance with an embodiment. In an embodiment, the laser exposure results in a morphological change to the core 605. For example, the exposed regions 639 are shown with a different shading to indicate the morphological change. In the case of a glass core 605, the exposed regions 639 may be converted to a crystalline crystal structure compared to an amorphous crystal structure for the remainder of the core 605.

It is to be appreciated that the laser patterning can be precisely controlled to allow for morphological changes at different depths within the core 605. For example, the central portion of the exposed region 639 is entirely embedded within the core 605. The ends of the exposed region 639 may extend up to a top surface of the core 605. Other embodiments may include an exposed region 639 that reaches to an edge of the core 605 (or to a scribe line where an edge will subsequently be formed) or to the bottom surface of the core 605.

Figure 6C:
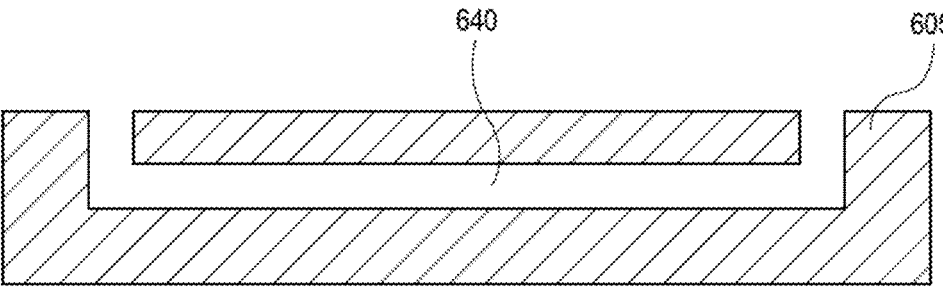

Referring now to FIG. 6C, a cross-sectional illustration of the core 605 after the exposed region 639 is removed with an etching process is shown, in accordance with an embodiment. In an embodiment, the exposed region 639 may be removed with an etching process to form the fluidic channel 640. For example, a wet etching process may be used in some embodiments. The etchant used may have a selectivity to the exposed regions 639 over the remainder of the core 605. For example, the selectivity may be 10:1 or greater or 50:1 or greater. It is to be appreciated that some of the unexposed portions of the core 605 may also be etched slightly due to a non-perfect etch selectivity.

Figure 6D:
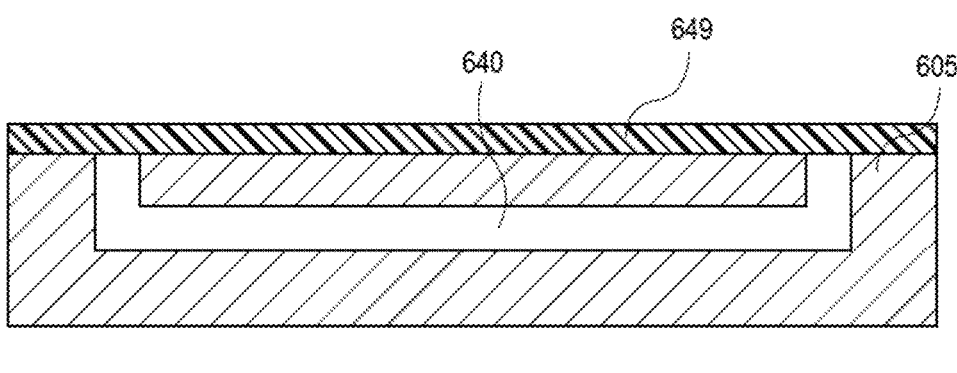

Referring now to FIG. 6D, a cross-sectional illustration of the core 605 after a mask 649 is selectively disposed over the fluidic channel 640 is shown, in accordance with an embodiment. In an embodiment, the mask 649 protects the fluidic channel 640 during the formation of conductive features (not shown) in the core 605. The conductive features (e.g., vias, planes, etc.) may also be fabricated with a laser-assisted etching process. Conductive material (e.g., copper) may be disposed into the via openings while the mask 649 protects the fluidic channel 640. The mask 649 may be removed after the formation of the conductive features.

Figure 6E:
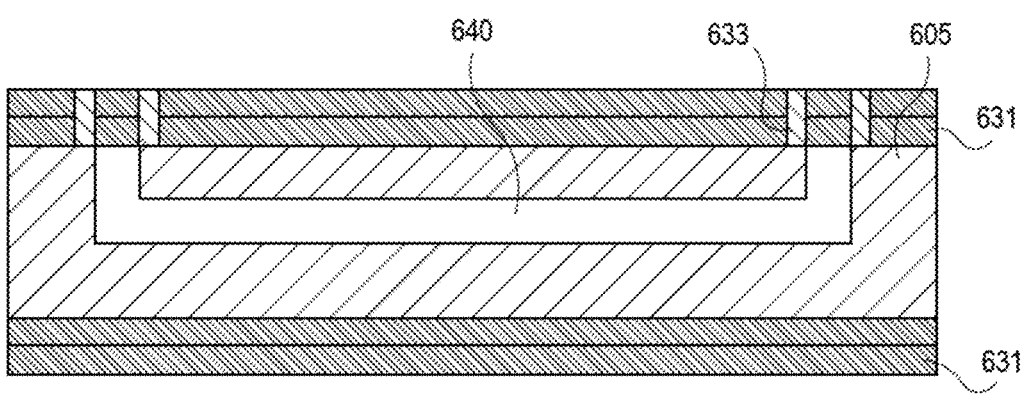

Referring now to FIG. 6E, a cross-sectional illustration of the core 605 after the formation of buildup layers 631 is shown, in accordance with an embodiment. In an embodiment, the buildup layers 631 may be formed with standard lamination, patterning, and/or plating processes. As shown, barrier layers 633 may be formed through the buildup layer over the ends of the fluidic channel 640. The barrier layers 633 may comprise copper or the like. For example, lithographic via processes may be used to form the barrier layers 633.

Figure 6F:
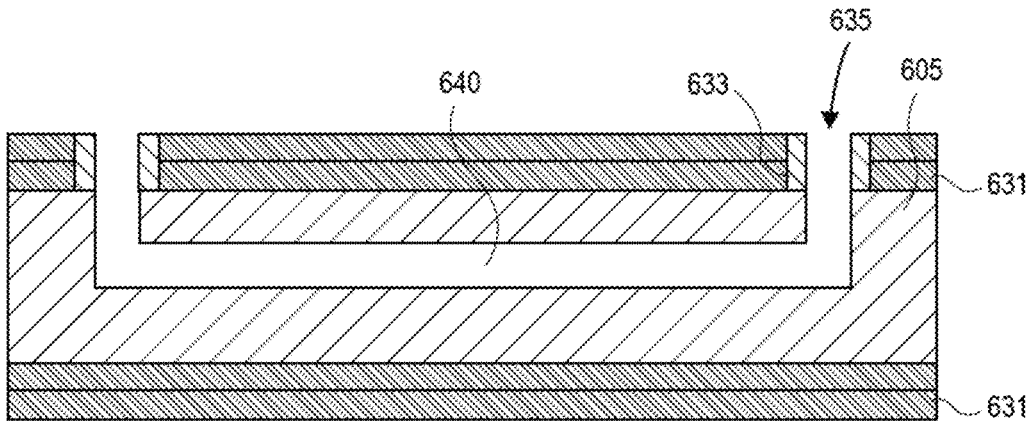

Referring now to FIG. 6F, a cross-sectional illustration of the core 605 after holes 635 are formed into the buildup layers 631 is shown, in accordance with an embodiment. In an embodiment, the holes 635 connect the fluidic channels 640 to the external environment. The holes 635 may be formed with a laser ablation process or any other suitable material removal process. In an embodiment, individual units may be singulated from a larger panel after the completion of the fluidic channels 640.

In addition to the formation of fluidic channels in package cores, embodiments may also include fluidic channels in interposer type architectures. On such embodiment is shown in FIG. 7A.

Figure 7A:
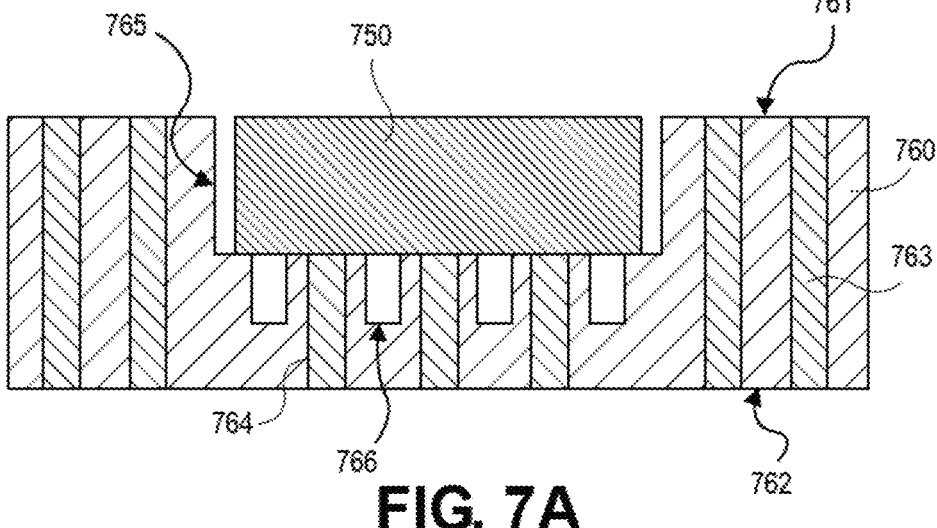
FIG. 7A is a cross-sectional illustration of an interposer with cooling channels below a recess for accommodating a die, in accordance with an embodiment.

Referring now to FIG. 7A, a cross-sectional illustration of a die 750 and an interposer 760 is shown, in accordance with an embodiment. The interposer 760 may comprise a material that can be morphologically altered by a laser exposure. For example, the interposer 760 may comprise glass, ceramic, silicon, or other non-conductive semiconductor materials. In an embodiment, structural features within the interposer 760 may be fabricated using a laser-assisted etching process, similar to processes described in greater detail above.

In an embodiment, a first recess 765 may be formed into a top surface 761 of the interposer 760. The first recess 765 may be sized to receive the die 750. In the illustrated embodiment, the thickness of the die 750 is substantially equal to the depth of the first recess 765. However, the depth of the first recess 765 may be greater than or less than the thickness of the die 750. In an embodiment, a plurality of second recesses 766 are formed into a bottom surface of the first recess 765. The combined depth of the first recess 765 and the second recesses 766 may be smaller than a thickness of the interposer 760. That is, the second recesses 766 may not extend through to the bottom surface 762 of the interposer 760. The second recesses 766 may be sealed by the die 750 (or a film such as a die attach film (DAF)). The second recesses 766 may be attached to a fluid input/output in order to flow a coolant through the second recesses 766 in order to remove heat from the die 750. In an embodiment, vias 763 may pass through an entire thickness of the interposer 760. Vias 764 may pass from the bottom of the first recess 765 to the bottom surface 762 of the interposer 760. The vias 764 may allow for electrical connections to be made to the die 750 through a thickness of the interposer 760.

Figure 7B:
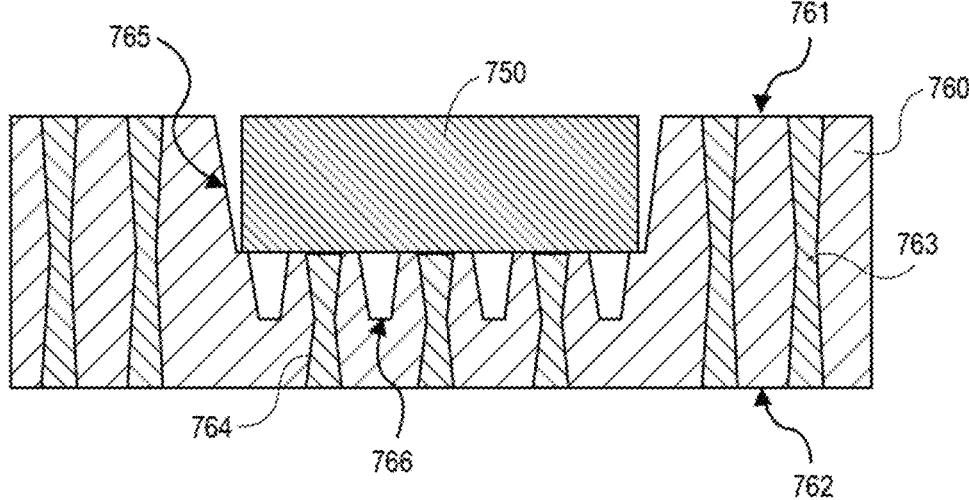
FIG. 7B is a cross-sectional illustration of an interposer with cooling channels below a recess for accommodating a die, where the sidewalls are sloped, in accordance with an embodiment.

Referring now to FIG. 7B, a cross-sectional illustration of an interposer 760 is shown, in accordance with an additional embodiment. The interposer 760 may be substantially similar to the interposer 760 in FIG. 7A, with the exception of the structural features having sloped sidewalls. The sloped sidewalls may be the characteristic result of using a laser-assisted etching process. For example, the vias 763 and 764 may have hourglass shaped cross-sections characteristic of dual sided laser-assisted etching processes. The first recess 765 and the second recesses 766 may have trapezoidal cross-sections typical of single sided laser-assisted etching processes used to form blind features.

Figure 8A:
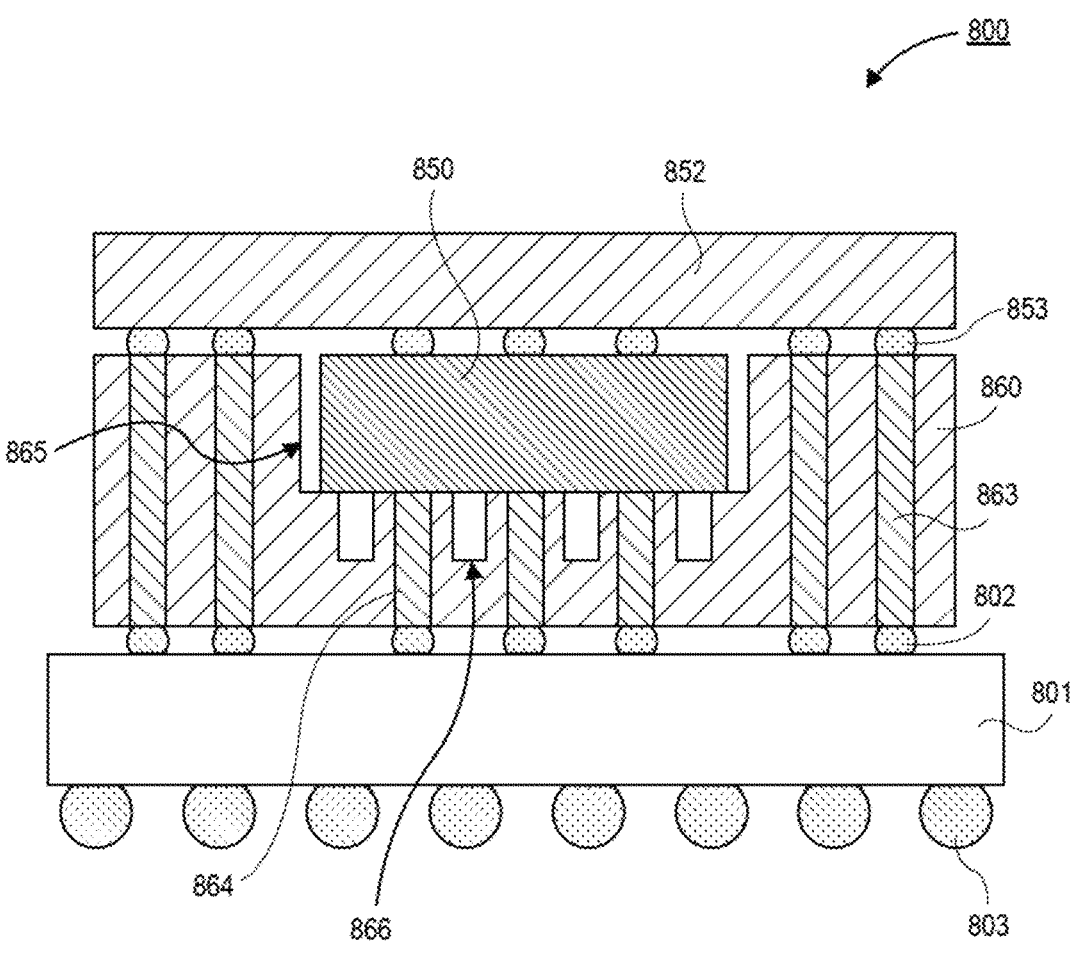
FIG. 8A is a cross-sectional illustration of an electronic package with an interposer with embedded cooling channels, in accordance with an embodiment.
Figure 8B:
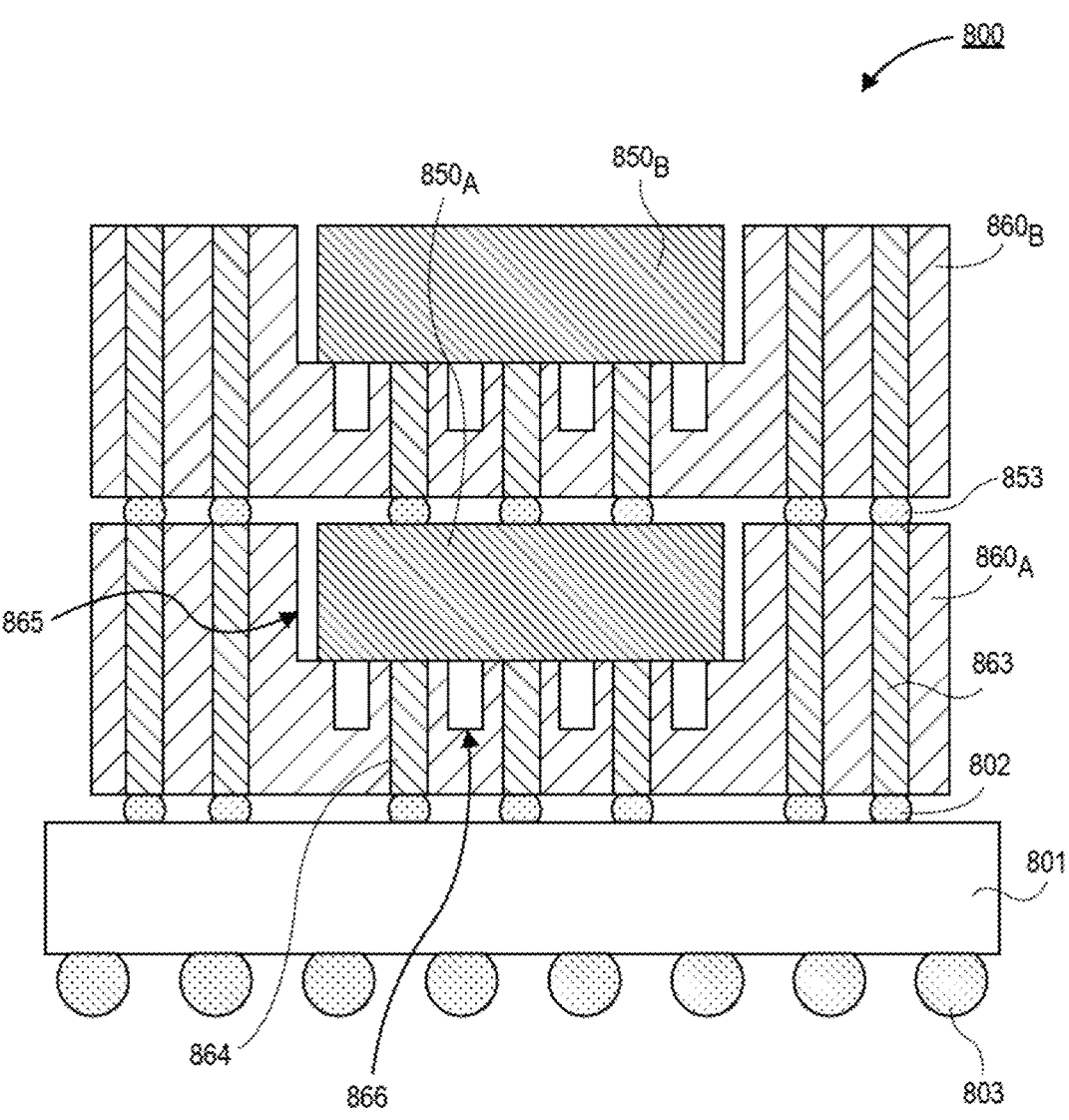
FIG. 8B is a cross-sectional illustration of an electronic package with a pair of interposers with embedded cooling channels, in accordance with an embodiment.

Referring now to FIGS. 8A and 8B, cross-sectional illustrations of electronic packages 800 that include interposers 860 with fluidic cooling channels 866 are shown, in accordance with various embodiments. As shown, multi-strata die architectures can benefit from such cooling arrangements.

Referring now to FIG. 8A, a cross-sectional illustration of an electronic package 800 is shown, in accordance with an embodiment. In an embodiment, the electronic package 800 comprises a package substrate 801. The package substrate 801 may be a cored or coreless package substrate 801. Interconnects 803 (such as solder balls, sockets, or the like) can be used to connect the package substrate 801 to a board (not shown). In an embodiment, interconnects 802 may be used to connect the package substrate 801 to an interposer 860.

In an embodiment, the interposer 860 may be substantially similar to the interposer 760 described above with respect to FIG. 7A. For example, the interposer 860 may comprise a first recess 865 for accommodating a die 850, and a plurality of second recesses 866 that function as fluidic channels to provide cooling to the die 850. In an embodiment, vias 863 and 864 may also be provided through the interposer 860. The vias 863 provide electrical coupling from a second die 852 to the package substrate 801. The second die 852 may be coupled to the interposer 860 and the first die 850 by FLIs 853. The vias 864 may electrically couple the first die 850 to the package substrate 801.

Referring now to FIG. 8B, a cross-sectional illustration of an electronic package 800 with a double interposer 860 architecture is shown, in accordance with an embodiment. As shown, the electronic package comprises a first interposer 860$_A$ with a first die 850$_A$, and a second interposer 860$_B$ with a second die 850$_B$. Both the first interposer 860$_A$ and the second interposer 860$_B$ may comprise cooling channels formed by the second recesses 866. While two interposers 860 are shown in the stack, it is to be appreciated that more than two interposers 860 may be stacked to accommodate any number of dies 850.

Figure 9A:
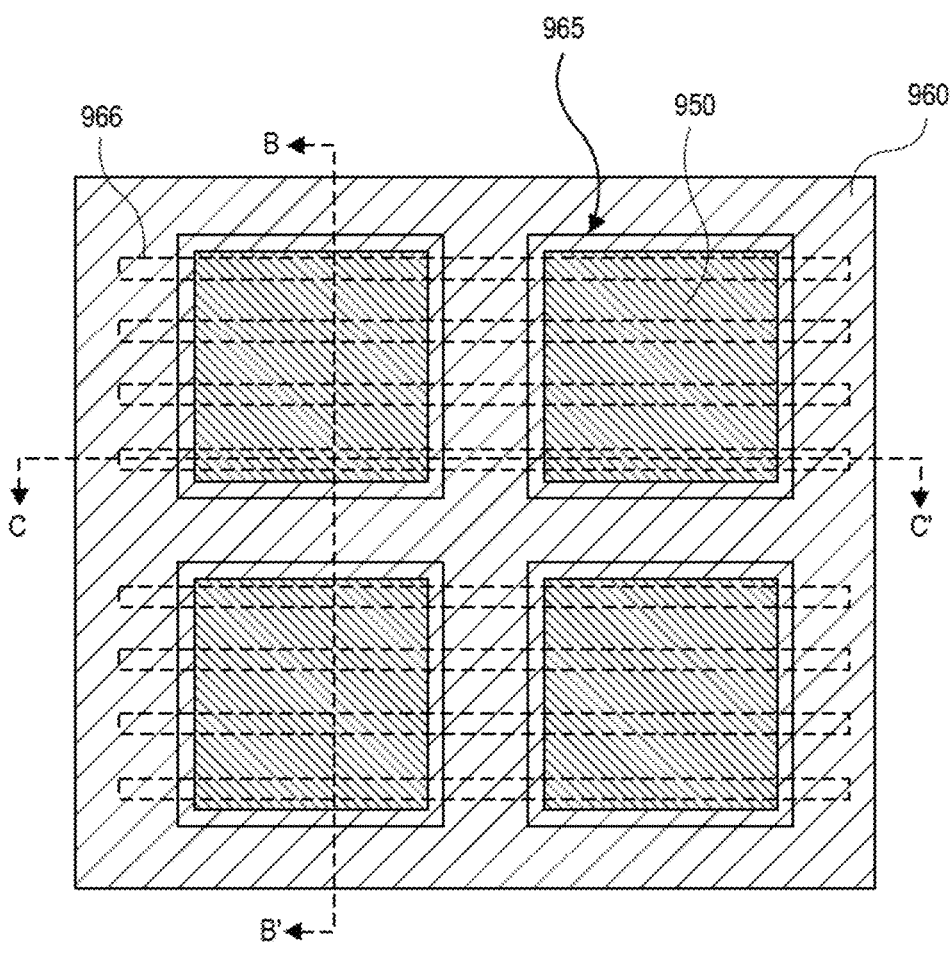
FIG. 9A is a plan view illustration of an interposer with embedded cooling channels, in accordance with an embodiment.
Figure 9B:
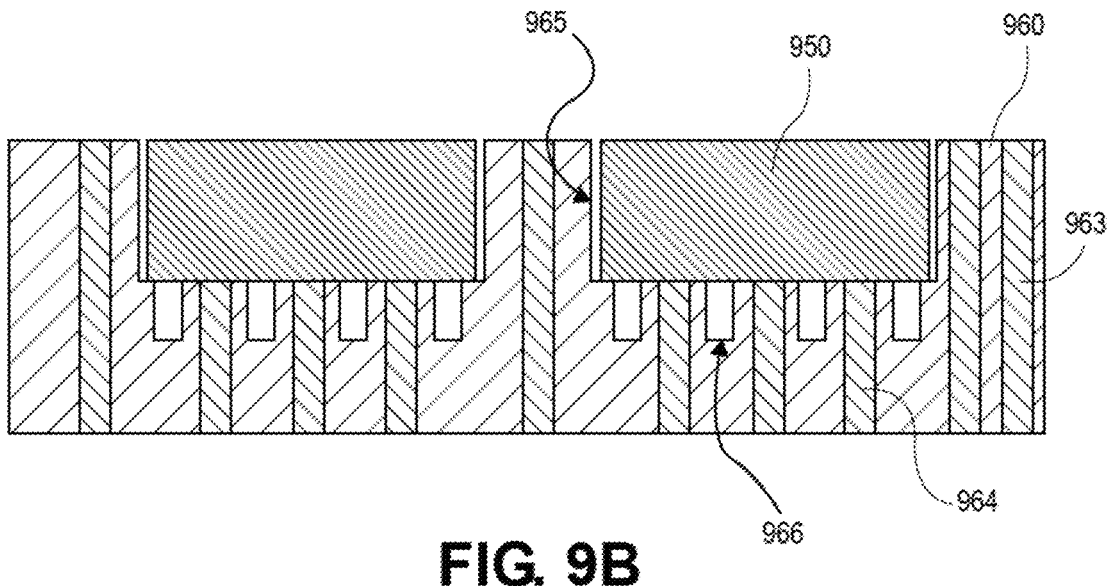
FIG. 9B is a cross-sectional illustration of the interposer in FIG. 9A along line B-B', in accordance with an embodiment.
Figure 9C:
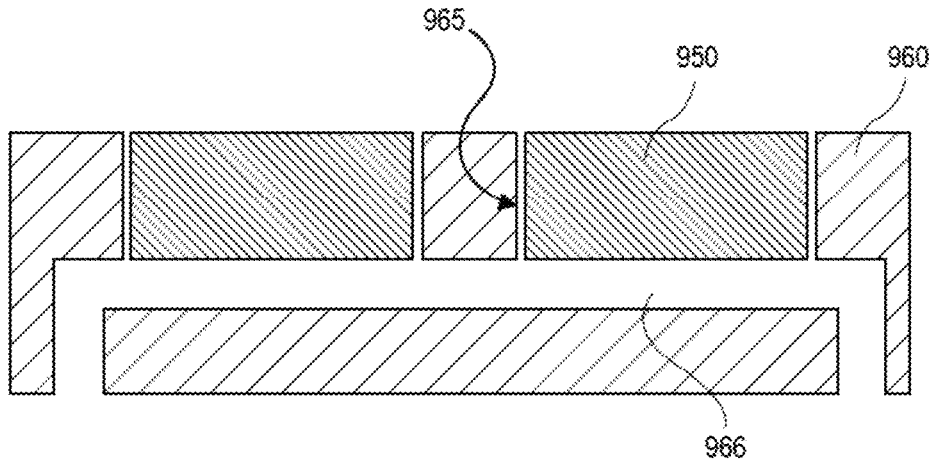
FIG. 9C is a cross-sectional illustration of the interposer in FIG. 9A along line C-C', in accordance with an embodiment.

Referring now to FIGS. 9A-9C, illustrations of an interposer 960 for accommodating a plurality of dies 950 are shown, in accordance with additional embodiments. FIG. 9A is a plan view illustration of the interposer 960. The interposer 960 may comprise a plurality of first recesses 965 to accommodate multiple dies 950. For example, four first recesses 965 accommodating four dies 950 are shown in FIG. 9A. As shown by the dashed boxes, second recesses 966 may pass below the four dies 950.

Referring now to FIG. 9B, a cross-sectional illustration of the interposer 960 in FIG. 9A along line B-B' is shown, in accordance with an embodiment. As shown, a pair of dies 950 fill the pair of first recesses 965. The second recesses 966 may be provided between vias 964 below the first recesses 965. Vias 963 may be provided around a perimeter of the interposer 960 and/or between the dies 950.

Referring now to FIG. 9C, a cross-sectional illustration of the interposer 960 in FIG. 9A along line C-C' is shown, in accordance with an embodiment. As shown, a single second recess 966 may extend across a pair of first recesses 965. Vertical inlets/outlets may be provided at ends of the second recesses 966. In other embodiments, the inlets/outlets may extend to an edge of the interposer 960 instead of having vertical components.

Figure 10:
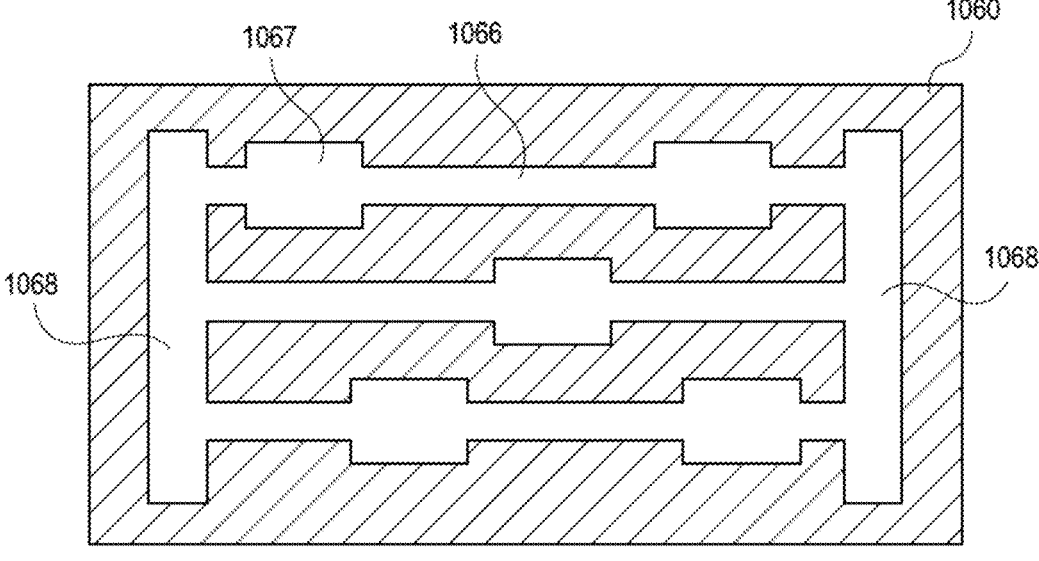
FIG. 10 is a plan view illustration of an interposer with cooling channels with wider regions to accommodate hotspots on the die, in accordance with an embodiment.

Referring now to FIG. 10, a plan view illustration of the second recesses in an interposer 1060 is shown, in accordance with an additional embodiment. As shown, the second recesses 1066 may all start/end at reservoirs 1068 that converge the plurality of second recesses 1066 to single inputs/outputs (not shown). In an embodiment, the second recesses 1066 may also comprise non-uniform widths along their length. For example, chambers 1067 may allow for more coolant fluid to interact with a region of the overlying die (not shown). The chambers 1067 may be placed in locations where increased thermal control is necessary (e.g., at hotspots on the dies).

Figure 11:
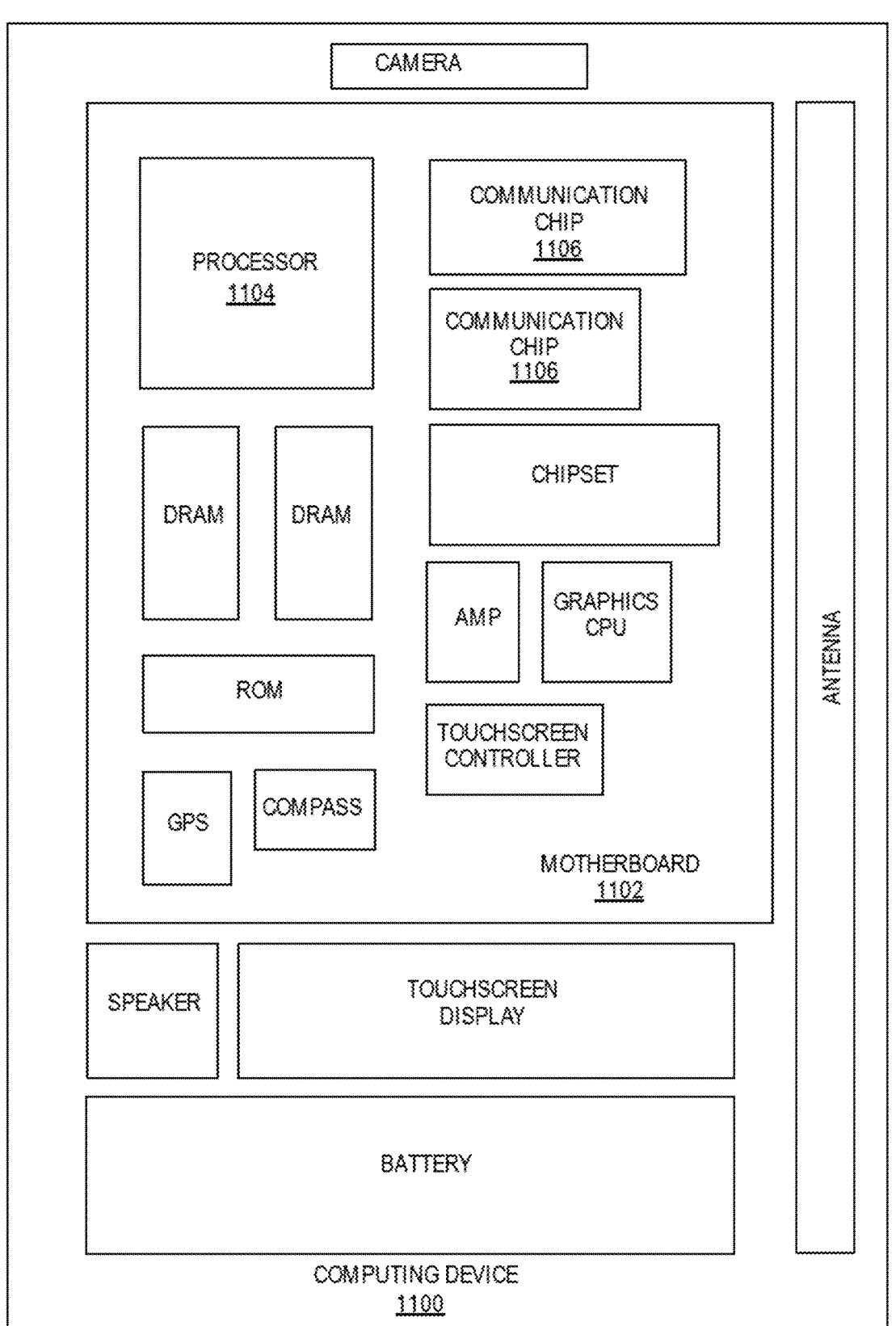
FIG. 11 is a schematic of a computing device built in accordance with an embodiment.

FIG. 11 illustrates a computing device 1100 in accordance with one implementation of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the invention, the integrated circuit die of the processor may be part of an electronic package that comprises a package substrate with a core that is patterned with a laser-assisted etching process to form fluidic cooling channels, in accordance with embodiments described herein. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of the invention, the integrated circuit die of the communication chip may be part of an electronic package that comprises a package substrate with a core that is patterned with a laser-assisted etching process to form fluidic cooling channels, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core with a first surface and a second surface opposite from the first surface; a buildup layer over the first surface of the core; and a channel through the core, wherein the channel extends in a direction that is substantially parallel to the first surface.

Example 2: the package substrate of Example 1, wherein a first end of the channel ends at a sidewall of the core.

Example 3: the package substrate of Example 2, wherein a second end of the channel ends at the first surface of the core.

Example 4: the package substrate of Example 3, further comprising: a hole through the buildup layer connecting to the channel, wherein sidewalls of the hole are lined with a barrier layer.

Example 5: the package substrate of Example 2, wherein a second end of the channel ends at a second sidewall of the core.

Example 6: the package substrate of Examples 1-5, wherein a first end of the channel ends at a sidewall of the core, and wherein a second end of the channel ends at the second surface of the core.

Example 7: the package substrate of Examples 1-5, wherein a first end of the channel ends at the first surface of the core, and wherein a second end of the channel ends at the first surface of the core.

Example 8: the package substrate of Examples 1-7, further comprising: through core vias between the first surface of the core and the second surface of the core.

Example 9: the package substrate of Example 8, wherein the through core vias have an hourglass shaped cross-section, and wherein at least one of the through core vias is a via plane.

Example 10: the package substrate of Examples 1-9, wherein the core is a glass core.

Example 11: a package substrate, comprising: a core with a first surface and a second surface opposite from the first surface; and a plurality of channels through the core, wherein the plurality of channels are at a depth within the core between the first surface and the second surface.

Example 12: the package substrate of Example 11, wherein the plurality of channels are substantially parallel to each other along their entire length.

Example 13: the package substrate of Example 11 or Example 12, wherein first ends of the plurality of channels end at a first reservoir, and wherein second ends of the plurality of channels end at a second reservoir.

Example 14: the package substrate of Examples 11-13, wherein the plurality of channels have a first pitch at a first end of the plurality of channels, and wherein the plurality of channels have a second pitch that is smaller than the first pitch at a location between the first end of the plurality of channels and a second end of the plurality of channels.

Example 15: the package substrate of Examples 11-14, wherein one or more of the plurality of channels have a turn of approximately ninety degrees.

Example 16: the package substrate of Examples 11-15, wherein the core is a glass core.

Example 17: the package substrate of Examples 11-16, wherein through core vias pass through a thickness of the core adjacent to one or more of the plurality of channels.

Example 18: the package substrate of Example 17, wherein the through core vias have a cross-section that is hourglass shaped.

Example 19: the package substrate of Examples 11-18, further comprising: buildup layers above and below the core.

Example 20: the package substrate of Example 19, wherein holes through the buildup layers connect to the plurality of channels, and wherein the holes are lined with a barrier layer.

Example 21: an electronic system, comprising: a board; a package substrate coupled to the board, wherein the package substrate comprises: a core; and channels through the core, wherein the channels extend in a direction parallel to a top surface of the core; and a die coupled to the package substrate, wherein a footprint of the die is provided over a portion of the channels.

Example 22: the electronic system of Example 21, wherein the core is a glass core.

Example 23: the electronic system of Example 21 or Example 22, wherein the channels have a first pitch outside of the footprint of the die and a second pitch that is smaller than the first pitch within the footprint of the die.

Example 24: the electronic system of Examples 21-23, wherein first ends of the channels are on a sidewall of the core, and wherein second ends of the channels are on the top surface of the core.

Example 25: the electronic system of Examples 21-23, wherein first ends of the channels are on a sidewall of the core, and wherein second ends of the channels are on a bottom surface of the core opposite from the die.

What is claimed is:

1. A package substrate, comprising:
a core with a first surface and a second surface opposite from the first surface;
a buildup layer over the first surface of the core;
a channel having a first portion through the core along a horizonal direction, and a second portion through the buildup layer along a vertical direction, wherein a first terminal end of the channel is in vertical alignment with a sidewall of the core, and wherein a second terminal end of the channel is at a top of the buildup layer;
a die coupled to the top of the build-up layer;
a first inlet/outlet at the first terminal end of the channel, the first inlet/outlet on the sidewall of the core and outside of a footprint of the die; and
a second inlet/outlet at the second terminal end of the channel and laterally spaced apart from the die.

2. The package substrate of claim 1,
wherein sidewalls of the second portion of the channel are lined with a barrier layer.

3. The package substrate of claim 1, further comprising:
through core vias between the first surface of the core and the second surface of the core.

4. The package substrate of claim 3, wherein the through core vias have an hourglass shaped cross-section, and wherein at least one of the through core vias is a via plane.

5. The package substrate of claim 1, wherein the core is a glass core.

6. A package substrate, comprising:

a core with a first surface and a second surface opposite from the first surface;

a buildup layer over the first surface of the core;

a plurality of channels through the core, wherein the plurality of channels are at a depth within the core between the first surface and the second surface, and wherein one of the channels has a first portion through the core along a horizontal direction, and a second portion through the buildup layer along a vertical direction, wherein a first terminal end of the one of the channels is in vertical alignment with a sidewall of the core, and wherein a second terminal end of the one of the channels is at a top of the buildup layer;

a die coupled to the top of the build-up layer;

a first inlet/outlet at the first terminal end of the one of the channels, the first inlet/outlet on the sidewall of the core and outside of a footprint of the die; and a second inlet/outlet at the second terminal end of the one of the channels and laterally spaced apart from the die.

7. The package substrate of claim 6, wherein the plurality of channels are substantially parallel to each other.

8. The package substrate of claim 6, wherein the plurality of channels have a first pitch at a first end of the plurality of channels, and wherein the plurality of channels have a second pitch that is smaller than the first pitch at a location between the first end of the plurality of channels and a second end of the plurality of channels.

9. The package substrate of claim 6, wherein the core is a glass core.

10. The package substrate of claim 6, wherein through core vias pass through a thickness of the core adjacent to one or more of the plurality of channels.

11. The package substrate of claim 10, wherein the through core vias have a cross-section that is hourglass shaped.

12. The package substrate of claim 6, further comprising: buildup layers below the core.

13. The package substrate of claim 12, wherein holes through the buildup layers connect to the plurality of channels, and wherein the holes are lined with a barrier layer.

14. An electronic system, comprising:

a board;

a package substrate coupled to the board, wherein the package substrate comprises:

a core;

a buildup layer over the first surface of the core; and channels through the core, wherein one of the channels has a first portion through the core along a horizontal direction, and a second portion through the buildup layer along a vertical direction, wherein a first terminal end of the one of the channels is in vertical alignment with a sidewall of the core, and wherein a second terminal end of the one of the channels is at a top of the buildup layer;

a die coupled to the top of the buildup layer of the package substrate, wherein a footprint of the die is provided over a portion of the channels;

a first inlet/outlet at the first terminal end of the one of the channels, the first inlet/outlet on the sidewall of the core and outside of a footprint of the die; and a second inlet/outlet at the second terminal end of the one of the channels and laterally spaced apart from the die.

15. The electronic system of claim 14, wherein the core is a glass core.

16. The electronic system of claim 14, wherein the channels have a first pitch outside of the footprint of the die and a second pitch that is smaller than the first pitch within the footprint of the die.

17. The electronic system of claim 14, wherein second ends of the channels are on the top surface of the core.

\*    \*    \*    \*    \*